United States Patent
Goden et al.

(10) Patent No.: US 10,244,193 B2
(45) Date of Patent: Mar. 26, 2019

(54) IMAGING APPARATUS AND IMAGING SYSTEM

(71) Applicant: CANON KABUSHIKI KAISHA, Tokyo (JP)

(72) Inventors: Tatsuhito Goden, Machida (JP); Hidekazu Takahashi, Zama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/845,817

(22) Filed: Dec. 18, 2017

(65) Prior Publication Data

US 2018/0184019 A1 Jun. 28, 2018

(30) Foreign Application Priority Data

Dec. 27, 2016 (JP) ................. 2016-254362

(51) Int. Cl.
| | |
|---|---|
| H04N 5/357 | (2011.01) |
| H04N 5/374 | (2011.01) |
| H04N 5/378 | (2011.01) |
| H04N 5/376 | (2011.01) |
| H01L 27/146 | (2006.01) |
| H04N 5/3745 | (2011.01) |

(52) U.S. Cl.
CPC ....... *H04N 5/357* (2013.01); *H01L 27/14603* (2013.01); *H04N 5/378* (2013.01); *H04N 5/3745* (2013.01); *H01L 27/14621* (2013.01); *H01L 27/14627* (2013.01)

(58) Field of Classification Search
CPC ...... H04N 5/357; H04N 5/3745; H04N 5/378; H04N 5/376; H04N 5/37457; H04N 5/374; H01L 27/14603; H01L 17/14621; H01L 27/14627; H01L 27/14667; H01L 27/14643; H01L 27/14636

USPC ........ 348/294, 308, 302; 257/292, 365, 401; 250/208.1, 214 A; 438/157, 161, 176, 438/195, 257; 330/252, 277

See application file for complete search history.

(56) References Cited

U.S. PATENT DOCUMENTS

| | | | |
|---|---|---|---|
| 8,836,839 B2 | 9/2014 | Choo | |
| 2013/0140442 A1* | 6/2013 | Yanagita | H01L 31/08 |
| | | | 250/208.1 |

(Continued)

FOREIGN PATENT DOCUMENTS

| | | |
|---|---|---|
| JP | 2010-521816 A | 6/2010 |
| JP | 2015-188129 A | 10/2015 |
| JP | 2015-198361 A | 11/2015 |

*Primary Examiner* — Marly S Camargo
(74) *Attorney, Agent, or Firm* — Canon U.S.A., Inc. IP Division

(57) ABSTRACT

A pixel circuit includes: a first signal output circuit having a first amplification portion with a first input node connected to a first electrode; a second signal output circuit having a second amplification portion with a second input node connected to a second electrode; a first capacitor connected to the first electrode and the first input node; and a first potential control portion configured to control a potential of the first electrode via the first capacitor, wherein the first potential control portion supplies a first potential that collects signal charge generated in a photoelectric conversion layer, or a second potential that transfers the signal charge in a first direction, to the first electrode.

20 Claims, 18 Drawing Sheets

(56) References Cited

U.S. PATENT DOCUMENTS

| | | | |
|---|---|---|---|
| 2016/0035772 A1* | 2/2016 | Yamashita | H01L 27/14603 257/432 |
| 2016/0150174 A1* | 3/2016 | Hynecek | 348/308 |
| 2018/0090533 A1* | 3/2018 | Otake | H01L 27/14641 257/79 |
| 2018/0151620 A1* | 5/2018 | Tashiro | H01L 27/14667 348/301 |
| 2018/0175102 A1* | 6/2018 | Togashi | 250/208.1 |

* cited by examiner

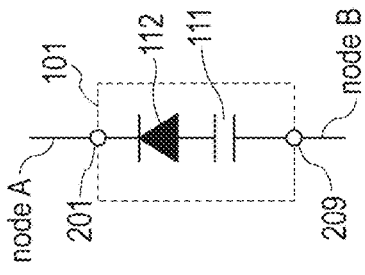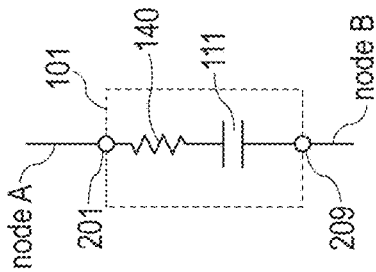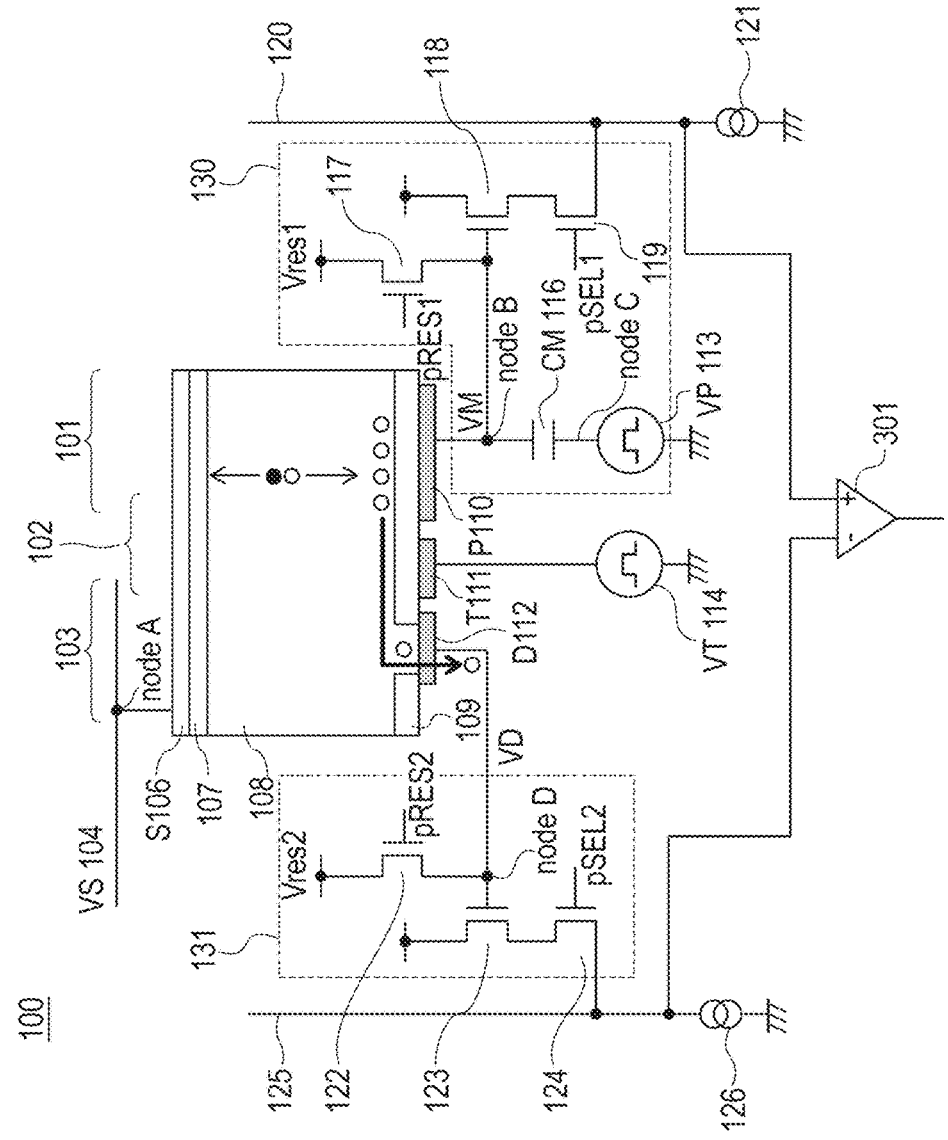

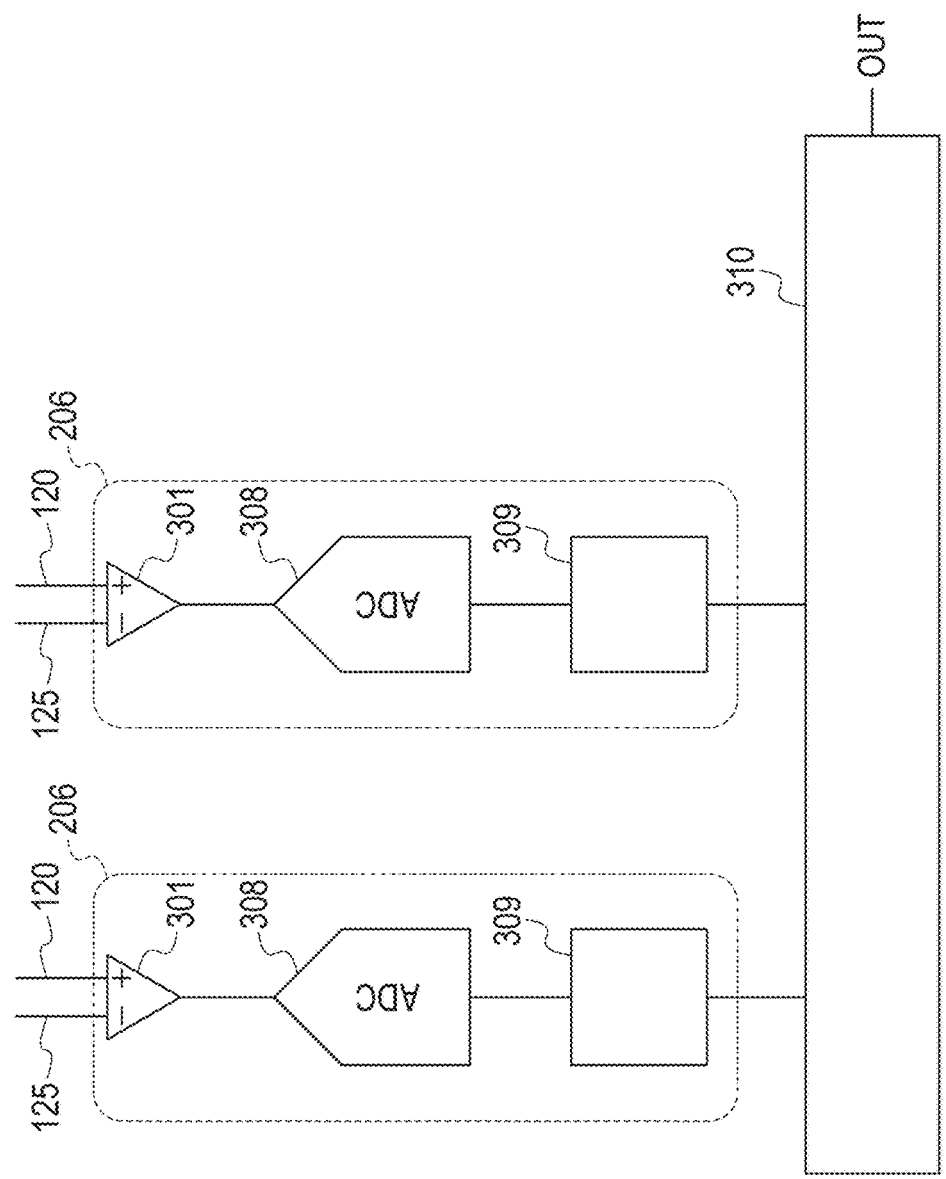

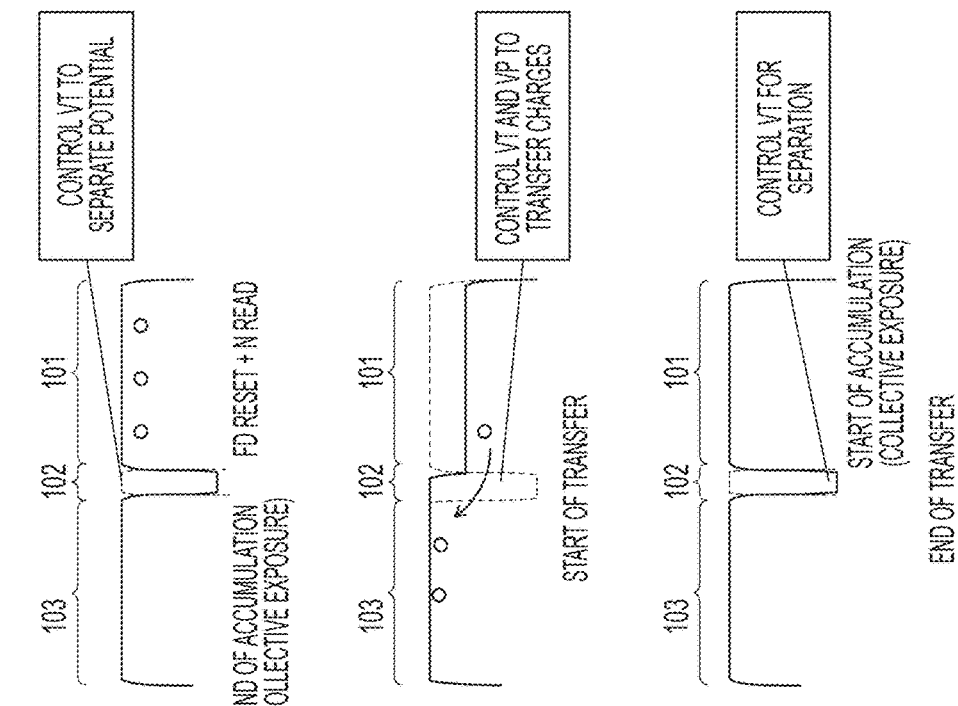
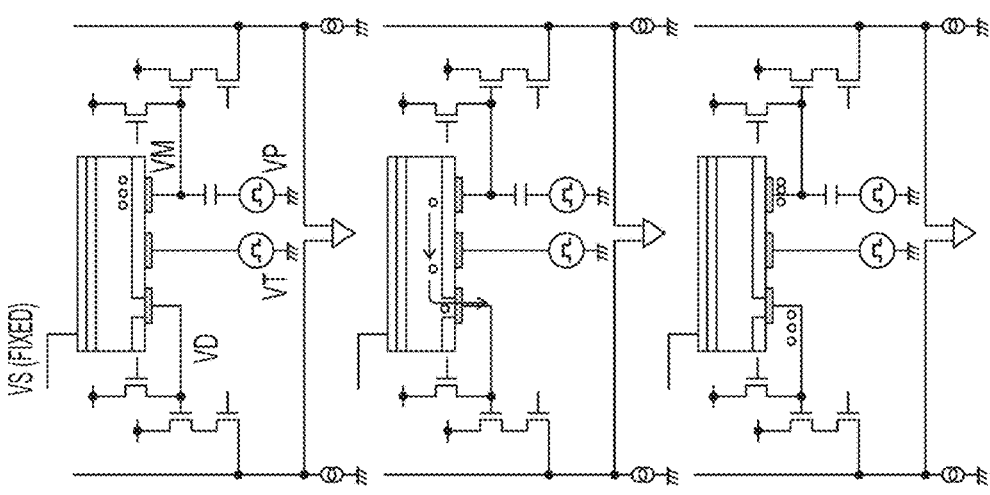

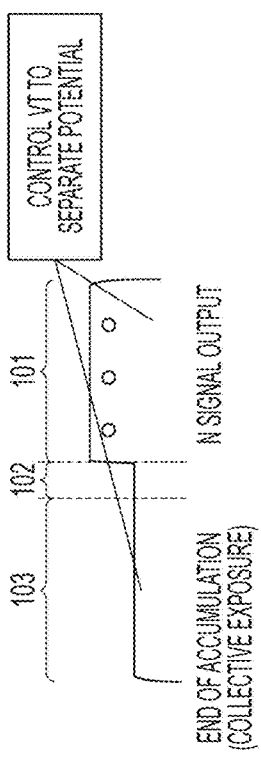
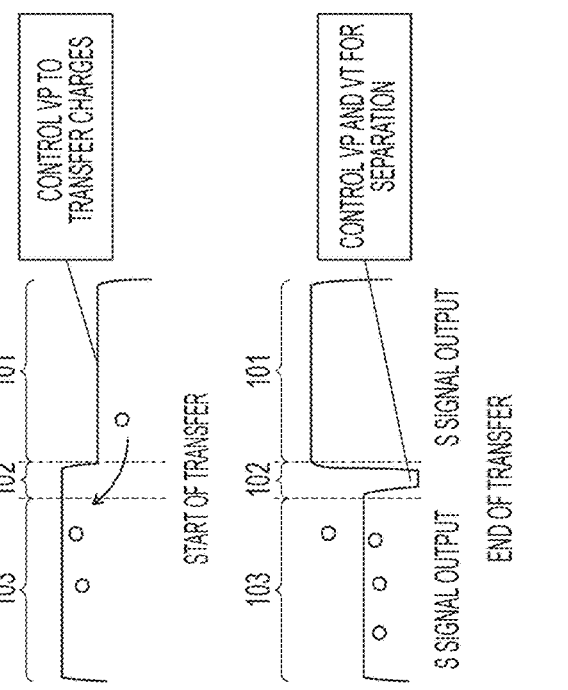
FIG. 11A  FIG. 11B  FIG. 11C  FIG. 11D  FIG. 11E  FIG. 11F

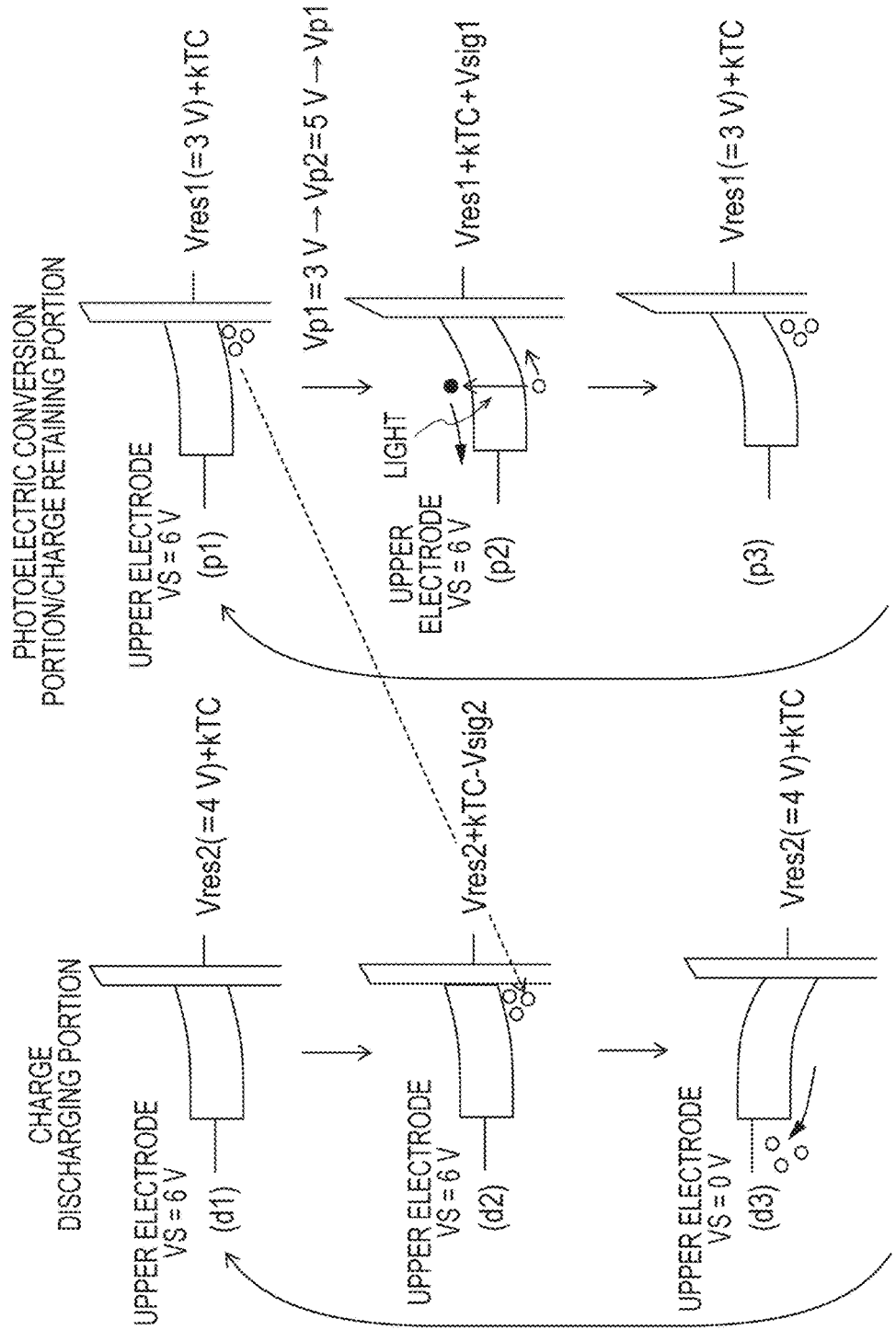

IMAGING APPARATUS AND IMAGING SYSTEM

BACKGROUND OF THE INVENTION

Field of the Invention

The aspect of the embodiments relates to an imaging apparatus and an imaging system.

Description of the Related Art

A lamination type imaging apparatus has been proposed as an imaging apparatus used for an image sensor of a camera, and the like.

A photoelectric conversion layer 43 is placed above a semiconductor substrate 20 in an imaging apparatus described in FIG. 1 of U.S. Pat. No. 8,836,839. An electrode 49 is placed on the photoelectric conversion layer 43, and an electrode 35 and a contact 31b are placed between the photoelectric conversion layer 43 and the semiconductor substrate 20. An insulating film 41 is placed between the photoelectric conversion layer 43 and the electrode 35, and is not placed between the photoelectric conversion layer 43 and the contact 31b.

Moreover, an electric potential V1 that accumulates electric charge in the photoelectric conversion layer 43 between the electrode 49 and the electrode 35, and a potential V2 that transfers the accumulated charge to the contact 31b are supplied to the electrode 35. The contact 31b is connected to a pixel circuit 21 from which a signal based on the charge transferred to the contact 31b is output.

SUMMARY OF THE INVENTION

An imaging apparatus including a plurality of pixels each having: a pixel circuit in a substrate; a first and a second electrode above the substrate, placed sequentially in a first direction being a direction along a surface of the substrate; an upper electrode above the first and second electrodes; a photoelectric conversion layer between the first and second electrodes and the upper electrode; and an insulating layer between the first electrode and the photoelectric conversion layer, wherein the pixel circuit includes a first signal output circuit having a first amplification portion with a first input node connected to the first electrode, a second signal output circuit having a second amplification portion with a second input node connected to the second electrode, a first capacitor connected to the first electrode and the first input node, and a first potential control portion configured to control a potential of the first electrode via the first capacitor, and the first potential control portion supplies a first potential that collects signal charge generated in the photoelectric conversion layer, or a second potential that transfers the signal charge in the first direction, to the first electrode.

Further features of the disclosure will become apparent from the following description of exemplary embodiments (with reference to the attached drawings).

BRIEF DESCRIPTION OF THE DRAWINGS

FIGS. 1A to 1C are schematic diagrams of a pixel configuration of an imaging apparatus.

FIG. 4 is an equivalent circuit diagram of the column circuits of the imaging apparatus.

FIGS. 6A to 6F are schematic diagrams of the operating principles and potential of a pixel.

FIGS. 11A to 11F are schematic diagrams of the operating principles and potential of a pixel.

FIG. 12 is an energy band structure diagram of the photoelectric conversion portion.

DESCRIPTION OF THE EMBODIMENTS

Figure 2:
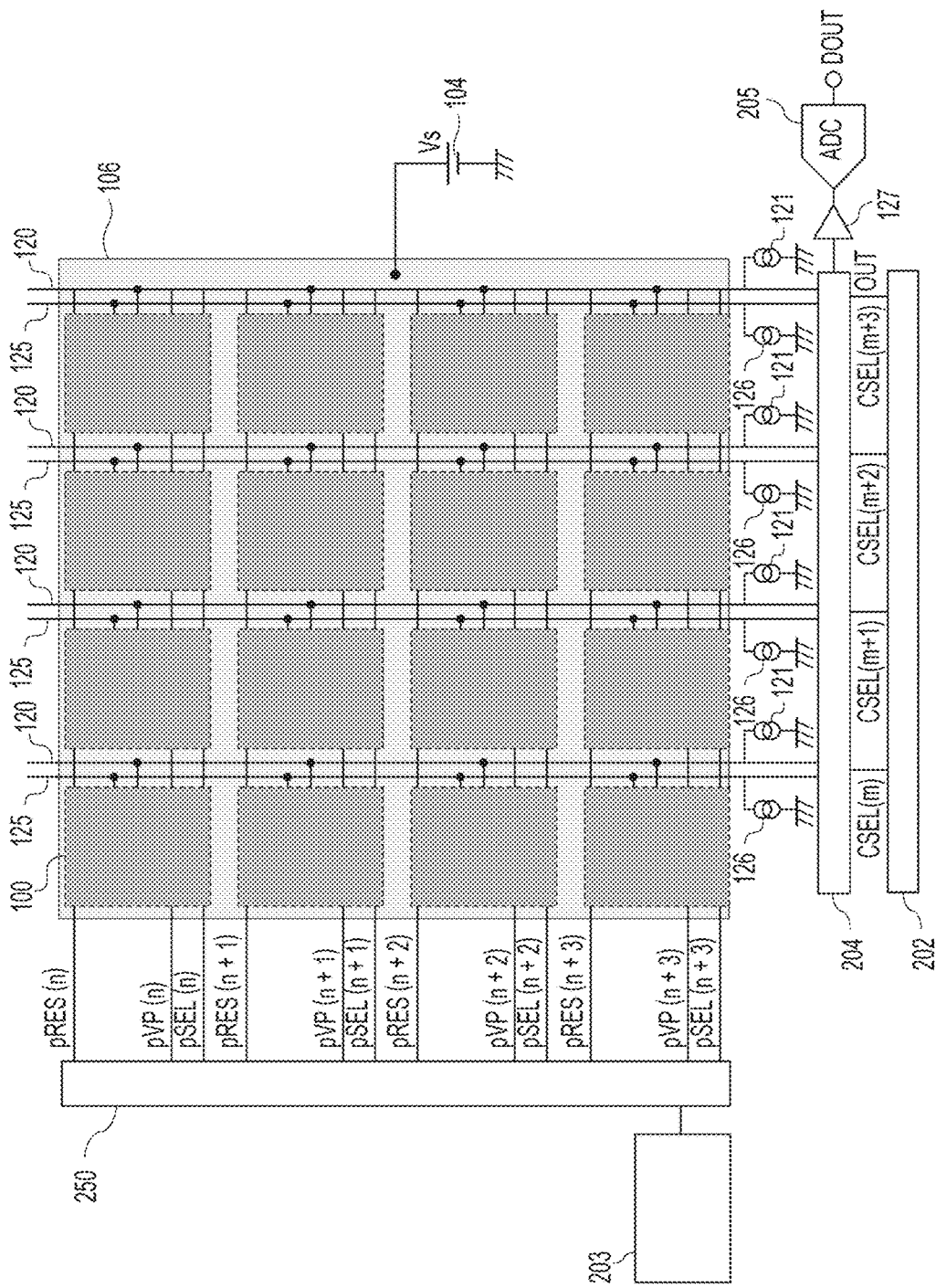
FIG. 2 is a schematic diagram of an entire configuration of the imaging apparatus.

In U.S. Pat. No. 8,836,839, a configuration where the electrodes are placed to control the accumulation of charge and the transfer of charge has been studied. However, a method has not been studied which improves the use efficiency of a signal based on the charge accumulated in the photoelectric conversion layer by using such electrodes.

An imaging apparatus of the present disclosure improves the use efficiency of a signal based on charge accumulated in a photoelectric conversion layer by using electrodes placed to control the accumulation of charge and the transfer of charge.

One embodiment according to the disclosure is an imaging apparatus including a plurality of pixels. The pixel included in the imaging apparatus of the embodiment includes: a pixel circuit in a substrate; a first and a second electrode above the substrate, placed sequentially in a first direction being a direction along a surface of the substrate; and an upper electrode above the first and second electrodes. Furthermore, the pixel includes: a photoelectric conversion layer between the first and second electrodes and the upper electrode; and an insulating layer between the first electrode and the photoelectric conversion layer.

The semiconductor layer includes a first region between the first electrode and the upper electrode, and a second region between the second electrode and the upper electrode.

The pixel circuit includes a first and a second signal output circuit. The first signal output circuit has a first amplification portion with an input node connected to the first electrode to output a signal based on charge generated in the photoelectric conversion layer. The second signal output circuit has a second amplification portion with an input node connected to the second electrode to output a signal based on charge generated in the photoelectric conversion layer. Furthermore, the pixel circuit includes: a first capacitor connected to the input node of the first amplification portion; and a potential control portion configured to control a potential of the first electrode via the first capacitor.

The potential control portion supplies a first potential that collects signal charge, or a second potential that transfers the signal charge in the first direction, to the first electrode.

According to the configuration of the embodiment, when the potential control portion supplies the first potential to the first electrode, the charge generated in the semiconductor layer is accumulated in the first region of the semiconductor layer. When the potential control portion supplies the second potential to the first electrode, the charge accumulated in the first region is transferred in the first direction along the surface of the substrate from the first region to the second region. Hence, the potentials of the first and second electrodes change.

The change in potential of the first electrode at this point in time changes the potential of the input node of the first amplification portion. The amount of the change in potential of the input node of the first amplification portion is output as a signal from the first signal output circuit. Similarly, the change in potential of the second electrode changes the potential of the input node. The amount of change in potential of the input node of the second amplification portion is output as a signal from the second signal output circuit. In other words, it becomes possible to output not only the signal based on the change in potential of the second electrode but also the signal based on the change in potential of the second electrode, and it becomes possible to improve the use efficiency of a signal based on charge accumulated in the photoelectric conversion layer.

Moreover, the polarities of the signals output from the first and second signal output circuits are opposite. Hence, in the configuration of the embodiment, an output node of the first signal output circuit is electrically connected to a non-inverting input terminal of a first differential amplifier circuit, and an output node of the second signal output circuit is electrically connected to an inverting input terminal of the first differential amplifier circuit. In other words, the first differential amplifier circuit takes a difference between the signal output from the first signal output circuit and the signal output from the second signal output circuit being the signal with a polarity different from that of the signal output from the first signal output circuit. According to such a configuration, it becomes possible to further improve the use efficiency of a signal based on charge accumulated in the photoelectric conversion layer. The differential amplifier circuit is used here. However, a differential circuit will do.

In the embodiment, the surface of the substrate is, for example, an interface between a semiconductor region and an insulator region on the semiconductor region. When an insulator isolation structure by STI (Shallow Trench Isolation) or LOCOS (Local Oxidation of Silicon) is used, the interface between the semiconductor region and the insulator region is not flat. In this case, for example, the interface between the semiconductor region and the insulator region in a channel of a transistor placed in the substrate is the surface of the substrate.

When MOS transistors are used for the first and second amplification portions, the area of an equivalent gate is also increased. Hence, RTN (Random Telegraph Noise) can also be reduced. Moreover, a difference is amplified to enable the cancellation of the same phase noise occurring in a signal line.

Exemplary embodiments of the disclosure are described in detail hereinafter using the drawings. The disclosure is not limited to only the exemplary embodiments described below. The exemplary embodiments of the disclosure also include modifications where the configurations of the exemplary embodiments described below are partly changed within a scope that does not depart from the purport of the disclosure. Moreover, the exemplary embodiments of the disclosure also include an example where a part of the configuration of any exemplary embodiment below is added to another exemplary embodiment, or an example where a part of the configuration of any exemplary embodiment below is replaced with a part of the configuration of another exemplary embodiment.

First Exemplary Embodiment

An imaging apparatus of an exemplary embodiment is described using FIGS. 1A to 9. Parts to which the same reference numerals are assigned in the drawings indicate the same elements or regions. In the exemplary embodiment, signal charge is described as positive holes (holes), and a hollow circle is assumed to be a positive hole. However, the signal charge may be electrons.

FIG. 1A illustrates a schematic diagram of a pixel 100 of the imaging apparatus of the exemplary embodiment. The imaging apparatus includes a substrate (not illustrated) where a pixel circuit included in the pixel 100 is placed, and a photoelectric conversion layer 108 placed above the substrate. FIG. 1A illustrates only one pixel 100 as an example.

The pixel 100 includes the photoelectric conversion layer 108. The photoelectric conversion layer 108 can be formed of a nonorganic semiconductor (nonorganic photoelectric conversion layer) such as silicon. Alternatively, the photoelectric conversion layer 108 can be formed of an organic semiconductor (organic photoelectric conversion layer). The photoelectric conversion layer 108 includes a first region 101, a second region 103, and a third region 102.

An upper electrode S106 that supplies a bias potential to the first region 101, the third region 102, and the second region 103 is placed above the photoelectric conversion layer 108. The upper electrode S106 is connected to a power supply VS104. The power supply VS104 supplies a potential Vs.

In the exemplary embodiment, the upper electrode S106 supplies the bias potential to both of the first region 101 and the second region 103. Hence, the upper electrode S106 is formed of a conductive layer continuously extending above the first region 101 and the second region 103. When viewed from another viewpoint, a first part of the upper electrode S106 supplies the bias potential to the first region 101, a second part of the upper electrode S106 to the second region 103. The first and second parts of the upper electrode S106 may be separated from each other.

The pixel 100 includes an electrode P110 (first electrode) that supplies the bias potential to the first region 101, an electrode D112 (second electrode) that supplies the bias potential to the second region 103, and a transfer electrode T111 (third electrode) that supplies the bias potential to the third region 102.

The first region 101 is a region placed between the electrode P110 and the upper electrode S106. The second region 103 is a region placed between the electrode D112 and the upper electrode S106. The third region 102 is a region placed between the transfer electrode T111 and the upper electrode S106. In the exemplary embodiment, the electrode D112 and the second region 103 of the semiconductor layer are in contact with each other.

The electrodes P110 and D112 are electrically separated from each other. With such a configuration, the bias potential can be supplied independently to the first region 101 and the second region 103.

The upper electrode S106 is configured in such a manner as to transmit a predetermined amount of light. For example, an ITO (Indium Tin Oxide) layer being a transparent conductive material or a metal layer fabricated into thin film is used for the upper electrode S106.

A blocking layer 107 for reducing the injection of charge from the upper electrode S106 to the photoelectric conversion layer 108 is placed between the upper electrode S106 and the photoelectric conversion layer 108. The blocking layer 107 of the exemplary embodiment is configured in such a manner as to prevent the entry of positive holes into the photoelectric conversion layer 108. Hence, the blocking layer 107 may be called a positive hole blocking layer. The blocking layer 107 can be formed from a material having a band gap different from the photoelectric conversion layer 108. Alternatively, the blocking layer 107 can be formed from a material having an impurity concentration different from that of the photoelectric conversion layer 108.

An insulating layer 109 is placed between the electrode P110 and the photoelectric conversion layer 108. The insulating layer 109 is placed in such a manner as not to extend over at least a part of the electrode D112. In a modification of the exemplary embodiment, the blocking layer 107 may be omitted.

The third region 102 is placed between the first region 101 and the second region 103. The transfer electrode T111 controls the bias potential supplied to the third region 102. In a modification of the exemplary embodiment, the third region 102 and the transfer electrode T111 are omitted.

FIGS. 1B and 1C illustrate examples of equivalent circuit diagrams of a photoelectric conversion portion including the first region 101. In the exemplary embodiment, the photoelectric conversion portion includes the photoelectric conversion layer 108 and the insulating layer 109. Therefore, the photoelectric conversion portion includes capacitance between the upper electrode S106 and the electrode P110. The equivalent circuits of FIGS. 1B and 1C illustrate the capacitance as a capacitor 111 placed between the upper electrode S106 and the electrode P110. FIG. 1B illustrates an exemplary embodiment where the photoelectric conversion portion includes the blocking layer 107. Hence, the blocking layer 107 and the photoelectric conversion layer 108 are illustrated as a diode circuit symbol 112. FIG. 1C illustrates an exemplary embodiment where the photoelectric conversion portion does not include the blocking layer. Hence, the photoelectric conversion layer 108 is illustrated as a resister circuit symbol 140.

Next, the structure of the photoelectric conversion layer 108 is described. In the exemplary embodiment, the first region 101 and the second region 103 are placed in a continuous area of the photoelectric conversion layer 108. The continuous area of the photoelectric conversion layer 108 is, for example, an area of the photoelectric conversion layer 108 that is formed from a substantially homogenous material. There occurs a manufacturing error upon manufacture of the imaging apparatus. Hence, the continuous area of the photoelectric conversion layer 108 may include a difference in material resulting from a manufacturing error. In other words, when viewed from another viewpoint, the continuous area of the photoelectric conversion layer 108 is an area formed simultaneously in the photoelectric conversion layer 108. After the continuous area of the photoelectric conversion layer 108 is formed simultaneously, only a part thereof may be processed. Therefore, the continuous area of the photoelectric conversion layer 108 may include a plurality of areas that are different in thickness or width from each other.

The function of each portion of the pixel 100 is described. The photoelectric conversion portion includes the first region 101 of the photoelectric conversion layer 108, the first part of the upper electrode S106 that is placed above the first region 101, the electrode P110, and the insulating layer 109 placed between the photoelectric conversion layer 108 and the electrode P110. The photoelectric conversion portion generates signal charge in accordance with incident light, and accumulates charge generated by incident light as the signal charge. The accumulation of the signal charge in the photoelectric conversion portion, and the discharge or transfer of the signal charge from the photoelectric conversion portion can be controlled in accordance with the potential supplied between the upper electrode S106 and the electrode P110.

The second region 103 of the photoelectric conversion layer 108 forms a charge exchanging portion. The charge of the photoelectric conversion portion is transferred to the charge exchanging portion. The second region 103 and the electrode D112 are in contact with each other. Accordingly, the charge transferred to the second region 103 moves to the electrode D112.

A charge transfer portion includes the third region 102 of the photoelectric conversion layer 108, the upper electrode S106, the transfer electrode T111, and the insulating layer 109 placed between the photoelectric conversion layer 108 and the transfer electrode T111. In the exemplary embodiment, the first region 101 and the second region 103 are placed in the continuous area of the photoelectric conversion layer 108 via the third region 102. With such a configuration, the charge transfer portion can facilitate the transfer of the charge accumulated in the first region 101 to the second region 103. The transfer of charge is controlled by the bias potential supplied by a power supply VT to the transfer electrode T111.

In the exemplary embodiment, the first region 101, the third region 102, and the second region 103 are placed in different parts of the photoelectric conversion layer 108 formed continuously. These regions are controlled independently of each other. Consequently, the first region 101, the third region 102, and the second region 103 achieve functions different from each other. The first region 101 has a function of the generation of charge by photoelectric conversion and functions of the accumulation of charge and the transfer of charge. The third region 102 has a function of assisting the transfer of charge from the first region 101 to the second region 103. The second region 103 has a function of exchanging the charge transferred from the first region 101.

Next, the configuration of a pixel circuit of the pixel 100 of FIG. 1A is described. The pixel circuit is placed in the unillustrated substrate. The photoelectric conversion layer 108 is placed on the substrate where the pixel circuit is placed. When viewed from another viewpoint, the photoelectric conversion layer 108 is laminated on the unillustrated substrate where the pixel circuit is placed. The substrate is, for example, a silicon substrate.

The pixel circuit includes a first signal output circuit 130 and a second signal output circuit 131. The first signal output circuit 130 includes a first rest transistor (first reset portion) 117, a first amplification transistor (first amplification portion) 118, and a first selection transistor (first selection portion) 119. The second signal output circuit 131 includes a second reset transistor (second reset portion) 122, a second amplification transistor (second amplification portion) 123, and a second selection transistor (second selection portion) 124. However, the first selection transistor 119 and the second selection transistor 124 may not be placed.

An input node of the first amplification transistor 118 is connected to the electrode P110. The input node of the first amplification transistor 118 is expressed as a node B. The node B can be made electrically floating. The node B is made electrically floating to make the potential of the node B changeable according to the charge accumulated in the first region 101.

The first amplification transistor 118 then outputs a signal based on the charge generated in the first region 101.

An input node of the second amplification transistor 123 is connected to the electrode D112. The input node of the second amplification transistor 123 is expressed as a node D. The node D can also be made electrically floating. The node D floats electrically to make the potential of the node D changeable according to the charge transferred from the first region 101 to the second region 103. The second amplification transistor 123 then outputs a signal based on the charge transferred from the first region 101.

The electrode P110 and the input node of the first amplification transistor 118 may be short-circuited. Alternatively, a switch may be placed on an electrical path between the electrode P110 and the first amplification transistor 118. The same shall apply to the electrode D112 and the second amplification transistor 123.

A drive signal pRES1 is supplied to a gate of the first reset transistor 117 to control the first reset transistor 117 in such a manner as to be switchable between on and off. The first reset transistor 117 resets the potential of the input node B of the first amplification transistor 118.

A drive signal pRES2 is supplied to a gate of the second reset transistor 122 to control the second reset transistor 122 in such a manner as to be switchable between on and off. The second reset transistor 122 resets the potential of the input node D of the second amplification transistor 123.

A drive signal pSEL1 is supplied to a gate of the first selection transistor 119 to control the first selection transistor 119 in such a manner as to be switchable between on and off. The first selection transistor 119 switches an electrical connection between the first amplification transistor 118 and a first signal line 120.

A drive signal pSEL2 is supplied to a gate of the second selection transistor 124 to control the second selection transistor 124 in such a manner as to be switchable between on and off. The second selection transistor 124 switches an electrical connection between the second amplification transistor 123 and a second signal line 125.

A plurality of the pixels 100 is connected to one first signal line 120 and second signal line 125. A first current source 121 is connected to the first signal line 120. The first amplification transistor 118 and the first current source 121 form a source follower circuit.

A second current source 126 is connected to the second signal line 125. The second amplification transistor 123 and the second current source 126 form a source follower circuit.

Furthermore, the pixel circuit includes a first capacitor CM116, a potential control portion VP113, and a power supply VT114. The first capacitor CM116 is connected to the input node of the first amplification transistor 118 and the electrode P110. The electrode P110 and the first capacitor CM116 may be short-circuited. Alternatively, a switch may be placed on an electrical path between the electrode P110 and the first capacitor CM116.

The first capacitor CM116 includes, for example, two electrodes facing each other across an insulator. The two electrodes are formed from a conductive material such as polysilicon or metal. Alternatively, the first capacitor CM116 is configured including a semiconductor region and a gate electrode placed on the semiconductor region via a gate insulating film. In one embodiment, the semiconductor region included in the first capacitor CM116 has an impurity concentration higher than a source region and a drain region of a transistor. The gate electrode is formed from a conductive material such as polysilicon or metal.

The first capacitor CM116 includes a first terminal electrically connected to the electrode P110, and a second terminal different from the first terminal. Each of the terminals can be formed from a conductive material such as metal or polysilicon, or a semiconductor region. A predetermined potential is supplied to the second terminal. In FIG. 1A, the node B includes the first terminal, and a node C includes the second terminal.

In the exemplary embodiment, the second terminal is connected to the potential control portion VP113. In other words, the potential control portion VP113 is connected to the input node of the first amplification transistor 118 and the electrode P110 via the first capacitor CM116. The potential control portion VP113 supplies a plurality of potentials including a first potential and a second potential different from the first potential to the electrode P110 via the first capacitor CM116. A potential VM is supplied to the node B, and a potential VP to the node C. The potentials VM and VP have a relationship in accordance with a capacitance value of the first capacitor CM116.

The power supply VT114 is connected to the transfer electrode T111. A third and a fourth potential are supplied as a potential VT to the transfer electrode T111. The supply of the third potential as the potential VT allows the formation of a potential barrier in the third region. Moreover, the fourth potential is supplied as the potential VT, and accordingly a potential barrier is not formed in the third region.

The supply of the first potential to the electrode P110 allows the accumulation of charge in the first region 101. At this point in time, the supply of the third potential to the transfer electrode T111 facilitates the accumulation of charge. Moreover, the supply of the second potential to the electrode P110 allows the transfer of the charge accumulated in the first region 101 to the second region 103. At this point in time, the supply of the fourth potential to the transfer electrode T111 facilitates the transfer of charge.

The first signal output circuit 130 is connected to a non-inverting input terminal of a differential amplifier circuit 301 via the first signal line 120. The second signal output circuit 131 is connected to an inverting input terminal of the differential amplifier circuit 301 via the second signal line 125. A signal output from the first signal output circuit 130 and a signal output from the second signal output circuit 131 have opposite polarities. Hence, the differential amplifier circuit 301 outputs a difference between the signals output from the first signal output circuit 130 and the second signal output circuit 131 as a difference signal to enable the output of a signal obtained by adding the absolute values of the two signals.

Next, the control of the pixel 100 is described. Firstly, during an exposure period, the potentials of the upper electrode S106 and the electrode P110 are controlled in such a manner as to apply a reverse bias to the first region 101. Consequently, signal charge generated in the first region 101 is accumulated in the first region 101 during the exposure period. Next, the potentials of the electrode P110, the transfer electrode T111, and the electrode D112 are controlled to transfer the charge retained in the first region 101 to the second region 103.

For example, the potential of the second region 103 is reduced as compared to the potential of the first region 101 to enable the transfer of the charge. The transfer of the accumulated signal charge causes a change in potential corresponding to the amount of the accumulated signal charge at the nodes B and D. Therefore, the amounts of change in potential at the nodes B and D of the pixel 100 can be output as signals based on signal charge from the first signal output circuit 130 and the second signal output circuit 131. When viewed from another viewpoint, in the exemplary embodiment, the transfer of charge of the first region 101 allows the signal based on the charge accumulated in the first region 101 to be output from the first signal output circuit 130. Furthermore, the exchange of the charge transferred from the first region 101 allows the signal based on the charge transferred to the second region 103 to be output from the second signal output circuit 131.

The potential VP of the second terminal of the first capacitor CM116 is controlled to control the potential VM of the electrode P110. The potential control portion VP113 supplies the first and second potentials as the potential VP to the second terminal of the first capacitor CM116.

In the exemplary embodiment, charge is transferred in a first direction from the first region 101 to the second region 103 in the photoelectric conversion layer 108. The first direction is a direction parallel to a surface of the substrate where the pixel circuit is placed. With such a configuration, it is possible to obtain, as signals, changes in both of the potential of the node B that has changed according to the transferred charge and the potential of the node D that has changed according to the discharged charge. The two signals are used as one signal to enable an improvement in use efficiency of the signal based on the charge accumulated in the photoelectric conversion layer.

Next, a potential supplied to each portion of the pixel 100 is described. In the exemplary embodiment, a case is described in which positive holes of charge generated by photoelectric conversion are used as signal charge. If the signal charge is electrons, the relationship of the magnitude of a potential is reversed. In the present description, unless otherwise specified, a potential of a grounded node is set at 0 V as a reference.

The predetermined potential Vs (6 V in the exemplary embodiment) is supplied from the power supply VS104 to the upper electrode S106. The potential VP (3 to 5 V in the exemplary embodiment) is supplied to the potential control portion VP113. The potentials Vs and VP have a relationship where a reverse bias is supplied to a positive hole in the first region 101. Positive holes generated by photoelectric conversion are accumulated near an interface between the first region 101 and the insulating layer 109.

In the exemplary embodiment, the signal charge is positive holes. Accordingly, the potential VM of the electrode P110 is lower than the potential VT of the transfer electrode T111 at the time of the accumulation of the signal charge. As described in FIGS. 5A and 5B described below, the transfer electrode T111 is placed on a surface parallel to the surface of the substrate in such a manner as to surround the perimeter of the electrode P110. Hence, when the potential VM<the potential VT is set, a potential well is formed in the first region 101 placed near the electrode P110. At this point in time, positive holes generated by photoelectric conversion are collected efficiently in the potential well in the first region 101. Moreover, the potential VT of the transfer electrode T111 forms a potential barrier in the third region 102. Accordingly, the leakage of the charge accumulated in the first region 101 can be reduced.

In the exemplary embodiment, the potential control portion VP113 supplies at least a first potential VP1 and a second potential VP2 different from the first potential VP1 to the second terminal of the first capacitor CM116. In the exemplary embodiment, the signal charge is positive holes, and accordingly the second potential VP2 is a potential higher than the first potential VP1. In the exemplary embodiment, the first potential VP1 and the second potential VP2 are, for example, 3 V, and 5 V, respectively. If the signal charge is electrons, the first potential VP1 and the second potential VP2 are, for example, 5 V and 3 V, respectively.

In the exemplary embodiment, a first reset potential Vres1 is, for example, a potential lower than the potential Vs supplied to the upper electrode S106. In the exemplary embodiment, the potential Vs supplied to the upper electrode S106 and the first reset potential Vres1 are, for example, 6 V and 3 V, respectively. If the signal charge is electrons, the potential Vs supplied to the upper electrode S106, and the first reset potential Vres1 are, for example, 3 V and 6 V, respectively.

In the exemplary embodiment, the potential VP including the plurality of potentials is supplied to the node C. Accordingly, the potential control portion VP113 controls the potential VM of the node B that capacitively couples to the node C via the first capacitor CM116. Hence, the relationship of the magnitude of direct current between the potential VP supplied to the node C, and the first reset potential Vres1 or the potential Vs supplied to the upper electrode S106 is not particularly restricted.

In the exemplary embodiment, the potential VM supplied to the electrode P110, the potential VT supplied to the transfer electrode T111, and the potential VD of the electrode D112 are controlled to transfer the signal charge accumulated in the first region 101 to the second region 103. The potential supplied to the electrode D112 here is determined by a second reset potential Vres2. If the signal charge is positive holes, the charge can be transferred on the basis of the relationship of the potential VM>the potential VT>the potential VD.

FIG. 2 is a block diagram of the imaging apparatus of the exemplary embodiment. In FIG. 2, reference numerals representing rows, such as (n) and (n+1), are assigned to distinguish drive signals supplied to different rows. Moreover, reference numerals representing columns, such as (m) and (m+1), are assigned to distinguish drive signals supplied to different columns.

FIG. 2 illustrates 16 pixels 100 placed in a matrix with four rows and four columns as an example. Each of a plurality of the pixels 100 included in one column is connected to the signal lines 120 and 125. A row drive circuit 250 supplies, to the pixel 100, the drive signal pRES (pRES1 and pRES2), a drive signal pVP (the potential VP of the node C), and the drive signal pSEL (pSEL1 and pSEL2).

The drive signal pRES is supplied to the gates of the first reset transistor 117 and the second reset transistor 122 of FIG. 1A. The drive signal pSEL is supplied to the gates of the first selection transistor 119 and the second selection transistor 124. The common drive signal pRES is supplied to the first reset transistor 117 and the second reset transistor 122, and the common drive signal pSEL to the first selection transistor 119 and the second selection transistor 124. However, it is not necessarily required to make the drive signals common. Drive signals may be prepared individually. However, the use of the common drive signal allows a reduction in the area of layout.

A plurality of the pixels 100 included in one row is connected to a common drive signal line. The drive signal line is wiring that transmits the above-mentioned drive signals pRES and pSEL, and the like.

In the exemplary embodiment, the potentials VP supplied to the second terminals (nodes C) of the first capacitors CM116 are controlled independently, row by row. Hence, the row drive circuit 250 selects a row that is supplied with the potential VP from the potential supply portion 203. When a global electronic shutter operation is performed, the drive signals are collectively driven in all the rows. When a rolling shutter operation is performed, the drive signals are controlled row by row.

Figure 3:
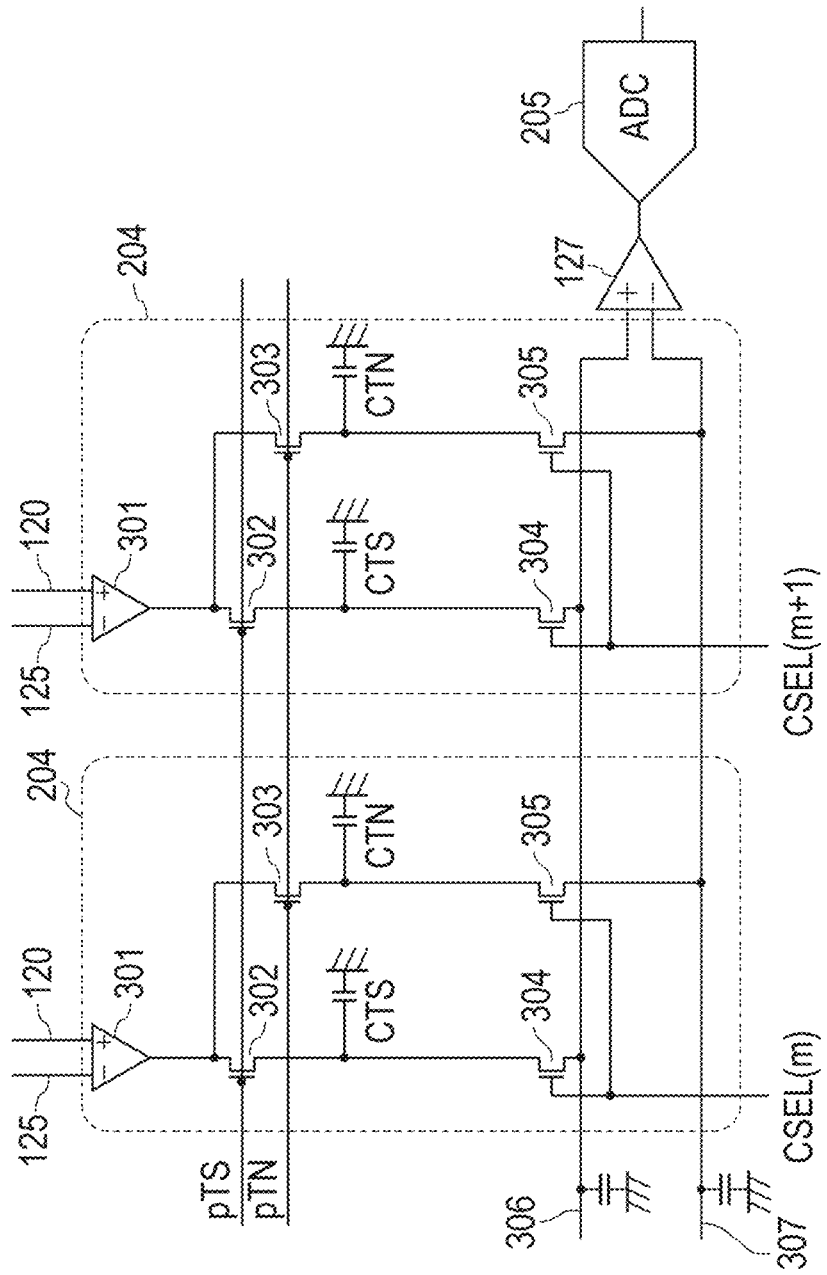
FIG. 3 is an equivalent circuit diagram of column circuits of the imaging apparatus.

Next, an equivalent circuit diagram of the column circuits of the imaging apparatus is described using FIG. 3. FIG. 3 illustrates an equivalent circuit of column circuits 204 of the m-th column and the m+1-th column. The illustration of the column circuits 204 of the other columns is omitted.

The first signal line 120 and the second signal line 125 are connected to their corresponding column circuit 204. The differential amplifier circuit 301 illustrated in FIG. 1 is included in the column circuit 204. A column drive circuit 202 drives the column circuits 204, column by column. Specifically, the column drive circuit 202 supplies a drive signal CSEL to a plurality of the column circuits 204. The same shall apply in the other drawings. With such a configuration, signals read in parallel row by row can be output sequentially to an output portion.

The differential amplifier circuit 301 outputs the signals of the first signal line 120 and the second signal line 125 as a difference signal. The differential signal output at this point in time becomes a signal obtained by adding the absolute values of the signals of the signal output circuits 130 and 131.

An output node of the differential amplifier circuit 301 is connected to a capacitor CTS via an S/H switch 302. Moreover, the output node of the differential amplifier circuit 301 is connected to a capacitor CTN via an S/H switch 303. The S/H switches 302 and 303 are controlled by drive signals pTS and pTN, respectively. Such a configuration allows the retention of a noise signal N including reset noise from the pixel 100 and a signal including an optical signal S and the noise signal N. Therefore, the imaging apparatus of the exemplary embodiment can perform correlated double sampling. In other words, the optical signal S from which the reset noise has been removed can be output.

The capacitor CTS is connected to a signal line 306 via a transfer switch 304. The capacitor CTN is connected to a signal line 307 via a transfer switch 305. The transfer switches 304 and 305 are controlled by the drive signal CSEL from the column drive circuit.

The signal line 306 is connected to a non-inverting input terminal of a second differential amplifier circuit 127. The signal line 307 is connected to an inverting input terminal of the second differential amplifier circuit 127. The second differential amplifier circuit 127 amplifies and outputs a difference signal between the signals of the signal lines 306 and 307. The amplified signal is input into an analog-to-digital conversion portion 205, converted from an analog signal to a digital signal, and then output to the outside of the imaging apparatus.

An analog-to-digital conversion circuit may be used for the column circuit 204. For example, FIG. 4 is an example of column circuits 206 that convert an output signal of the differential amplifier circuit 301 from analog to digital. An output of the differential amplifier circuit 301 is connected to an analog-to-digital conversion portion 308. An output of the analog-to-digital conversion portion 308 is connected to a memory 309. The memory 309 is connected to a digital signal output circuit 310. The noise signal N and optical signal S signal output from the differential amplifier circuit 301 is converted by the analog-to-digital conversion portion 308 into a digital signal, and retained in the memory 309. A difference signal of the noise signal N and the optical signal S of each column is generated by the digital signal output circuit, and output to the outside of the imaging apparatus. In this manner, noise generated in the pixel circuit can be reduced due to analog-to-digital conversion by the column circuit.

Figure 5B:
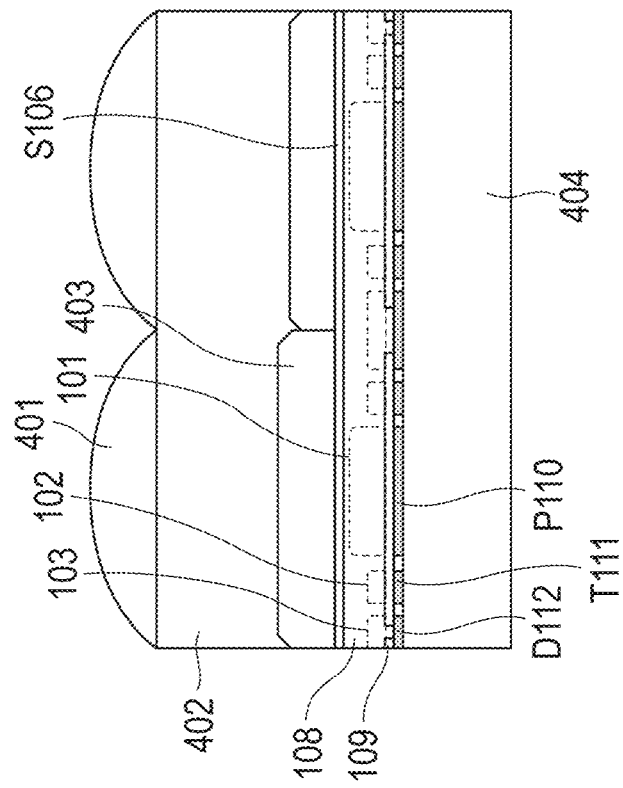
FIGS. 5A and 5B are a schematic plan view and a schematic cross-sectional view of pixels.
Figure 5A:
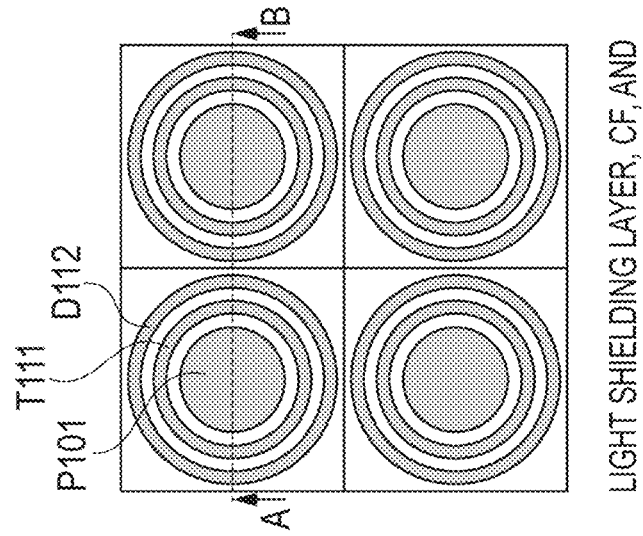

Next, a schematic plan view and a schematic cross-sectional view of the pixels 100 of the exemplary embodiment are described using FIGS. 5A and 5B. FIG. 5A illustrates the pixels 100 of two rows and two columns. FIG. 5A schematically illustrates the placement of the electrode P110, the transfer electrode T111, and the electrode D112 on the surface parallel to the surface of the substrate where the pixel circuit is placed.

As illustrated in FIG. 5A, the transfer electrode T111 is placed in such a manner as to surround the electrode P110, and the electrode D112 is placed in such a manner as to surround the transfer electrode T111, in plan view.

Moreover, such a placement allows the charge accumulated in the first region 101 to be transferred quickly to the second region 103. As a result, the drive speed of the imaging apparatus can be increased. Moreover, the bias potential supplied to the transfer electrode T111 can form a potential barrier to the signal charge between the first region 101 and the second region 103. Consequently, the generated charge can be collected efficiently in the first region 101. Furthermore, the leakage of the collected charge to the second region 103 and an adjacent pixel can be suppressed. It is configured in such a manner that charge can be transferred quickly and completely during transfer of charge. If the transfer electrode T111 is not placed, the electrode D112 is placed in such a manner as to surround the electrode P110.

A cross-section illustrated in FIG. 5B corresponds to a cross-section along a line segment AB in FIG. 5A. FIG. 5B illustrates a microlens 401, a planarization layer 402, a color filter 403, and an interlayer film 404 placed between the photoelectric conversion layer 108 and the substrate. The first region 101, the third region 102, and the second region 103 are illustrated in the photoelectric conversion layer 108. An unillustrated conductive material that connects the electrode and the pixel circuit is placed in the interlayer film 404.

The upper electrode S106 is formed from a conductive material that transmits a predetermined amount of light. For example, a compound including indium such as ITO (Indium Tin Oxide) and/or tin, or a compound such as ZnO is used as a material of the upper electrode S106. Such a configuration allows much light to enter the first region 101. Hence, sensitivity can be improved. As another example, polysilicon or metal having a thickness to an extent that transmits the predetermined amount of light may be used as the upper electrode S106. Metal has low resistance, and accordingly, an exemplary embodiment where metal is used for the material of the upper electrode S106 is advantageous to reduce the amount of power consumed and increase the drive speed. The light transmittance of the upper electrode S106 is not particularly limited as long as it is not zero.

The photoelectric conversion layer 108 is formed from, for example, intrinsic amorphous silicon (hereinafter a-Si), P-type a-Si of low concentration, or N-type a-Si of low concentration. Alternatively, the photoelectric conversion layer 108 may be formed from a compound semiconductor. Examples include III-V compound semiconductors such as BN, GaAs, GaP, AlSb, and GaAlAsP, II-VI compound semiconductors such as CdSe, ZnS, and HdTe, and IV-VI compound semiconductors such as PbS, PbTe, and CuO.

Alternatively, the photoelectric conversion layer 108 may be formed from an organic material. For example, fullerene, coumarin 6 (C6), rhodamine 6G (R6G), zinc phthalocyanine (ZnPc), quinacridone, phthalocyanine compounds, and naphthalocyanine compounds can be used. Furthermore, a quantum dot film made from the above-mentioned compound semiconductor can be used for the photoelectric conversion layer 108. In one embodiment, the impurity concentration of the photoelectric conversion layer 108 is low or the photoelectric conversion layer 108 is intrinsic. Such a configuration enables a depletion layer to expand sufficiently in the photoelectric conversion layer 108. Accordingly, effects such as an improvement in sensitivity and noise reduction can be obtained.

The blocking layer 107 prevents charges of the same conductive type as the signal charges from being injected from the upper electrode S106 to the photoelectric conversion layer 108. If the upper electrode S106 is made from ITO, the upper electrode S106 can also serve as the blocking layer 107 depending on the combination with a semiconductor forming the photoelectric conversion layer 108. In other words, a potential barrier is formed to prevent charges of the same conductive type as the signal charges from being injected from the upper electrode S106 to the photoelectric conversion layer 108.

A semiconductor of the same type as the semiconductor used for the photoelectric conversion layer 108, the semiconductor being of the N-type or P-type at a impurity concentration higher than the semiconductor used for the photoelectric conversion layer 108, can be used for the blocking layer 107. If, for example, a-Si is used for the photoelectric conversion layer 108, N-type a-Si at a high impurity concentration, or P-type a-Si at a high impurity concentration is used for the blocking layer 107. The position of the Fermi level varies depending on the difference in impurity concentration. Accordingly, a potential barrier can be formed against only one of electrons and positive holes. The blocking layer 107 is of a conductive type where charges of a conductive type opposite to the signal charge are major carriers.

Alternatively, a material different from that of the photoelectric conversion layer 108 can form the blocking layer 107. Such a configuration allows the formation of a heterojunction. The band gap varies depending on the difference in material. Accordingly, a potential barrier can be formed against only one of electrons and positive holes.

The insulating layer 109 is placed between the photoelectric conversion layer 108 and the electrode P110, the transfer electrode T111, and the electrode D112. An insulating material is used for the insulating layer 109. Examples of the material of the insulating layer 109 include inorganic materials such as silicon oxide, amorphous silicon oxide (hereinafter a-SiO), silicon nitride, and amorphous silicon nitride (a-SiN), and organic materials. The insulating layer 109 is to have a thickness to an extent that does not transmit charges due to tunneling. Such a configuration allows a reduction in leak current. Accordingly, noise can be reduced. Specifically, the thickness of the insulating layer 109 may be equal to or greater than 50 nm.

If a-Si, a-SiO, and a-SiN are used for the blocking layer 107, the photoelectric conversion layer 108, and the insulating layer 109, a hydrogenation process may be performed to terminate dangling bonds with hydrogen. With such a configuration, noise can be reduced.

Each of the electrode P110, the transfer electrode T111, and the electrode D112 is formed from a conductive material such as metal. The same material as a conductive material forming wiring, or a conductive material forming a pad electrode for a connection to the outside is used for the electrode P110, the transfer electrode T111, and the electrode D112. According to such a configuration, a part or whole of the electrode P110, the transfer electrode T111, the electrode D112, the wiring, and the pad electrode can be formed simultaneously.

In one embodiment, the electrode P110, the transfer electrode T111, and the electrode D112 are placed such that their centers of gravity agree with each other. Such a configuration allows the microlens 401 to focus incident light efficiently on the photoelectric conversion portion (the first region 101 and the electrode P110). The potential distribution and light incidence distribution of the photoelectric conversion portion are aligned. Accordingly, charge generated by photoelectric conversion is collected efficiently in the first region 101.

Operation of the exemplary embodiment is described using FIGS. 6A to 6F. FIGS. 6A to 6C schematically illustrate the operation of the signal charges (positive holes) in the photoelectric conversion layer 108. FIGS. 6D to 6F schematically illustrate a potential at the interface between the photoelectric conversion layer 108 and the insulating layer 109. In each of FIGS. 6D to 6F, the horizontal axis indicates the position of the photoelectric conversion layer 108 in the first direction parallel to the surface of the substrate, and the vertical axis indicates the potential of positive holes. The upper along the vertical axis, the potential of positive holes is increasingly reduced. Therefore, the upper along the vertical axis, the potential is increasingly reduced.

FIG. 6A illustrates a state where positive holes generated by photoelectric conversion are accumulated in the first region 101. FIG. 6D illustrates a schematic diagram of the potential of positive holes in the first region 101, the third region 102, and the second region 103, the schematic diagram corresponding to FIG. 6A.

In this case, the potential VM of the electrode P110, the potential VT of the transfer electrode T111, and the potential VD of the electrode D112 satisfy a relationship of VD=VM<VT, a relationship of VD<VM<VT, or a relationship of VM<VD<VT.

The potential barrier between the first region 101 and the second region 103 is controlled by the potential VT supplied to the transfer electrode T111 at this point in time to switch the electrical connection. In other words, the transfer electrode T111 operates as a separate electrode that separates the first region 101 and the second region 103.

In one embodiment, when the potential of the upper electrode S106 is set at Vs, it is to set Vs=VT. Accordingly, electric separation performance is improved. The potential VM of the electrode P110 is controlled on the basis of the potential VP supplied from the potential control portion VP113, and the capacitance value of the first capacitor CM116.

FIG. 6B illustrates a state where the positive holes accumulated in the first region 101 are transferred to the second region 103. FIG. 6E illustrates a schematic diagram of the potential of positive holes in the first region 101, the third region 102, and the second region 103, the schematic diagram corresponding to FIG. 6B. In this case, the potential VM of the electrode P110, the potential VT of the transfer electrode T111, and the potential VD of the electrode D112 satisfy a relationship of VD=VT<VM or a relationship of VD<VT<VM.

This relationship allows the formation of the slope of the potential between the first region 101 and the second region 103. Hence, the positive holes accumulated in the first region 101 are transferred to the second region 103 along the interface between the photoelectric conversion layer 108 and the insulating layer 109. The second region 103 is electrically connected to the electrode D112 to change the potential of the input node D.

FIG. 6C illustrates a state after the signal charges are transferred to the second region 103. FIG. 6F illustrates a schematic diagram of the potential of positive holes in the first region 101, the third region 102, and the second region 103, the schematic diagram corresponding to FIG. 6C. The potential VM of the electrode P110, the potential VT of the transfer electrode T111, and the potential VD of the electrode D112 are the same as a state before the signal charges are transferred, that is, the state illustrated in FIG. 6D. Specifically, the relationship of VD=VM<VT, the relationship of VD<VM<VT, or the relationship of VM<VD<VT is satisfied. At this point in time, the signal charges accumulated by the transfer operation disappear in the first region 101.

Hence, the potential at the input node B of the first amplification transistor 118 connected to the electrode P110 changes according to the amount of charges transferred to the second region 103 via capacitive coupling by the insulating layer 109. Moreover, the potential at the input node D of the second amplification transistor 123 connected to the electrode D112 changes by the amount of charges transferred to the second region 103. In other words, a signal in accordance with the amount of the signal charges accumulated in the first region 101 during the exposure period is output from the first signal output circuit 130 and the second signal output circuit 131.

In the exemplary embodiment, the photoelectric conversion layer 108 is continuous along the direction parallel to the surface of the substrate from the first region 101 to the second region 103 through the third region 102. Therefore, as illustrated in FIG. 6B, the signal charge generated in the photoelectric conversion layer 108 is transferred along the direction parallel to the surface of the substrate where the pixel circuit is placed. Such a configuration allows the transfer of charge in the direction along the interface between the photoelectric conversion layer 108 and the insulating layer 109. The interface between them has a low crystal lattice defect level. Accordingly, charge is transferred at high speeds. In this manner, according to the imaging apparatus of the embodiment, charge can be transferred efficiently. Hence, noise such as an image lag due to residual charge can be reduced.

In the exemplary embodiment, the potential VP supplied by the potential control portion VP113 is changed to control the potential VM of the electrode P110. However, in an exemplary embodiment where the first reset potential Vres1 of the node B is lower than the potential VD of the electrode D112, the potential VP supplied by the potential control portion VP113 may be fixed. The potential VT of the transfer electrode T111 is simply controlled to enable the transfer of charge. Furthermore, the first capacitor CM116 can be omitted. However, even if the first capacitor CM116 is omitted, the node B can have parasitic capacitance.

Figure 7:
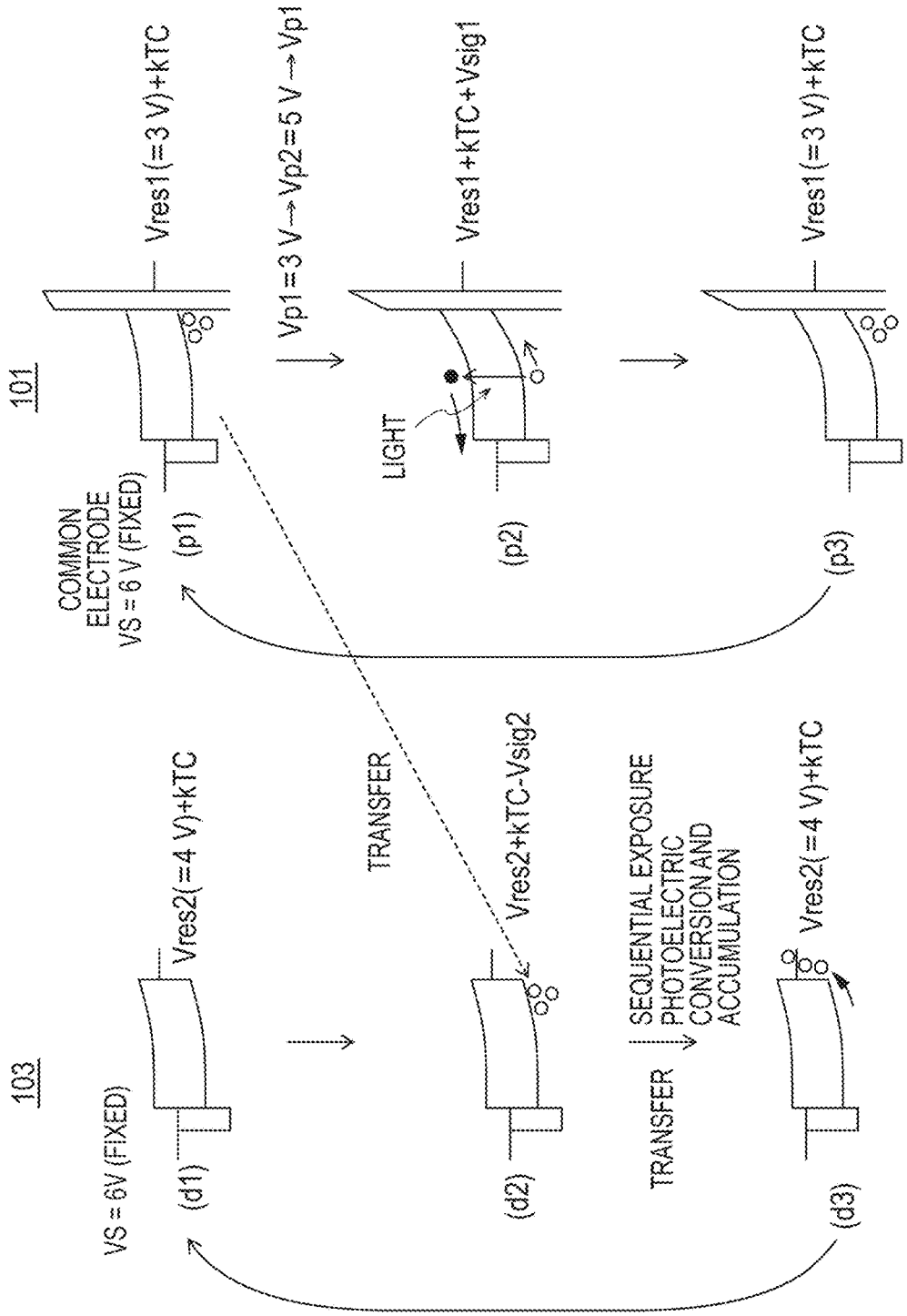
FIG. 7 is an energy band structure diagram of a photoelectric conversion portion.

Next, the operation of outputting a signal by transferring the signal charge to the second region 103 is described using FIG. 7. FIG. 7 schematically illustrates an energy band of the photoelectric conversion layer 108 along a direction vertical to the surface of the substrate. In FIG. 7, the vertical axis indicates the potential of positive holes. The upper along the vertical axis, the potential of the positive holes is increasingly reduced. Therefore, the upper along the vertical axis, the potential is increasingly reduced.

In terms of the upper electrode S106, the electrode P110, and the electrode D112, the energy level of free electrons is indicated. In terms of the blocking layer 107 and the photoelectric conversion layer 108, the band gap between the energy level of a conduction band and the energy level of a valence band is indicated. The potential of the photoelectric conversion layer 108 at the interface between the photoelectric conversion layer 108 and the insulating layer 109 is called a surface potential of the photoelectric conversion layer 108, or simply the surface potential, for the sake of convenience.

The right side of FIG. 7 illustrates an energy band in the first region 101. The left side of FIG. 7 illustrates an energy band in the second region 103. In terms of the first region 101, the energy band of the upper electrode S106, the blocking layer 107, the photoelectric conversion layer 108, the insulating layer 109, and the electrode P110 is illustrated. In terms of the second region 103, the energy band of the upper electrode S106, the blocking layer 107, the photoelectric conversion layer 108, and the electrode D112 is illustrated.

The operation of the first region 101 includes the transfer of charge (step p1), the accumulation of the signal charge generated by photoelectric conversion of incident light (step p2), and a state where the signal charge has been accumulated (step p3). The steps are described below.

In step p1, as described in FIGS. 6A to 6F, the signal charge accumulated in the first region 101 is transferred to the second region 103 via the third region 102. The first region 101 changes from a state where positive holes have been accumulated to a state where the positive holes have disappeared. On the other hand, the second region 103 changes from a state where there are no positive holes to a state where the positive holes are being retained.

In the state before the signal charge is transferred, that is, in the exposure period for accumulating the signal charge, the first rest potential Vres1 is supplied to the electrode P110. The second reset potential Vres2 is supplied to the electrode D112. In the exemplary embodiment, the first reset potential Vres1 is 3 V, and the second reset potential Vres2 is 4 V. The potentials of the electrodes P110 and D112 at this point in time can include noise kTC at the time of reset. The potential Vs supplied to the upper electrode S106 is fixed at 6 V.

In the exemplary embodiment, the potential control portion VP113 supplies a first potential VP1 (=3 V) and a second potential VP2 (=5 V).

When the signal charge (positive holes) generated during the exposure period is accumulated in the first region 101 in step p1, the potential control portion VP113 supplies the first potential VP1 (=3 V) lower than the potential Vs (=6 V) of the upper electrode S106.

In step p1, the potential control portion VP113 supplies the second potential VP2 (=5 V) to transfer the charge.

When the potential VP supplied by the potential control portion VP113 changes, the potential of the electrode P110 (the node B of FIG. 1A) changes toward the same direction as the change of the potential VP. A change amount dVM of the potential of the electrode P110 is determined according to the ratio between a capacitance value C1 of the first capacitor CM116 connected to the electrode P110 and a capacitance value C2 of a second capacitor of the first region 101.

The change amount dVM of the potential of the electrode P110 with reference to a change amount dVP (=VP2−VP1) of the potential of the node C is expressed as dVM=dVP× C1/(C1+C2). The node B including the electrode P110 can include another capacitance. However, the other capacitance is sufficiently smaller than the capacitance value C1 of the first capacitor CM116. Hence, the capacitance value of the node B can be regarded to be equal to the capacitance value C1 of the first capacitor CM116.

In the exemplary embodiment, the potential of the electrode P110 changes by the change amount dVM. Accordingly, the surface potential of the first region 101 is increased as compared to the potential VD of the electrode D112. As a result, the charge of the first region 101 is transferred to the second region 103.

Next, the first potential VP1 (=3 V) is supplied again to the node B. Consequently, the slope of the potential of the photoelectric conversion layer 108 is reversed again. Hence, the electrons injected into the photoelectric conversion layer 108 are discharged from the photoelectric conversion layer 108. On the other hand, the blocking layer 107 prevents the injection of positive holes from the upper electrode S106 to the photoelectric conversion layer 108. Therefore, the surface potential of the photoelectric conversion layer 108 changes according to the amount of positive holes retained.

When the signal charge is transferred, the node (the node B of FIG. 1A) including the electrode P110 is floating electrically. Therefore, in response to the change of the surface potential, the potential of the electrode P110 changes from the reset state by a potential Vsig1 corresponding to the amount of positive holes that have disappeared. In other words, the potential Vsig1 corresponding to the amount of positive holes retained as the signal charge appears at the node B. The potential Vsig1 corresponding to the amount of positive holes retained is called an optical signal component. The optical signal component Vsig1 is a signal based on the signal charge generated by photoelectric conversion.

Moreover, the node (the node D of FIG. 1A) including the electrode D112 is also floating electrically. Therefore, the potential of the electrode D112 changes from the reset state by a potential −Vsig2 corresponding to the signal charge (positive holes) transferred to the second region 103 (the change is opposite to that of Vsig1, and accordingly the minus symbol is assigned).

In other words, the potential −Vsig2 corresponding to the amount of positive holes retained as the signal charge appears at the node C. The potential −Vsig2 is also an optical signal component, and is a signal based on the signal charge generated by photoelectric conversion.

After the signal including the optical signal component Vsig1 is output from the signal output circuit 130, and the signal including the optical signal component −Vsig2 is output from the signal output circuit 131, the potentials of the electrode P110 and the electrode D112 are reset, and then photoelectric conversion starts.

In the first region 101, positive holes of electron-hole pairs generated by incident light are accumulated as the signal charge. The electrons are discharged to the upper electrode S106. As a result, positive holes of the amount corresponding to the amount of incident light are accumulated in the interface between the first region 101 and the insulating layer 109.

Next, the operation of the pixel circuit is described. As the operation of the pixel circuit, the following steps m1 to m3 are repeatedly performed.

In step m1, the input nodes of the first amplification transistor 118 and the second amplification transistor 123 are reset. In step m2, the noise signal N is read (N read). In step m3, the optical signal S is read (S read). The steps are described below.

In step m1, the first reset transistor 117 and the second reset transistor 122 are turned on. The potential of the input node B including the electrode P110, that is, the input node B of FIG. 1A is reset to the first reset potential Vres1. Moreover, the potential of the input node D including the electrode D112, that is, the input node D of FIG. 1A is reset to the second reset potential Vres2. The first reset transistor 117 and the second reset transistor 122 may be on during the exposure period. Alternatively, the first reset transistor 117 and the second reset transistor 122 may be on immediately before the reading of the noise signal N.

In step m2, the first reset transistor 117 and the second reset transistor 122 are subsequently turned off. Consequently, the nodes B and D float electrically. At this point in time, the reset noise (noise kTC) caused by the first reset transistor 117 and the second reset transistor 122 can occur.

The first selection transistor 119 and the second selection transistor 124 are turned on. The first amplification transistor 118 then outputs a noise signal N1 including the reset noise (Vres1+kTC1) from the pixel 100. The second amplification transistor 123 then outputs a noise signal N2 including the reset noise (Vres2+kTC2) from the pixel 100 (N read).

The noise differential signal N (Vres1+kTC1−Vres2−kTC2) is output by the differential amplifier circuit 301, and retained in the capacitor CTN of the column circuit 204.

As described above, the signal charge is subsequently transferred from the first region 101 to the second region 103. After the transfer of the signal charge, the first selection transistor 119 and the second selection transistor 124 are turned on in step m3. Consequently, the first amplification transistor 118 outputs the optical signal S (Vsig1+Vres1+kTC1) from the pixel 100, and the second amplification transistor 123 outputs the optical signal S (−Vsig2+Vres2+kTC2) from the pixel 100. The optical differential signal S (Vsig1+Vres1+kTC1+Vsig2−Vres2−kTC2) from the differential amplifier circuit 301 is retained in the capacitor CTS of the column circuit 204.

The difference (Vsig1+Vsig2) between the noise differential signal N read in step m2 and the optical differential signal S read in step m3 becomes a signal (optical signal component) based on the potential corresponding to the signal charge retained. In other words, the use efficiency of a signal based on charge accumulated in the photoelectric conversion layer can be improved.

Both of the optical signal components Vsig1 and Vsig2 are based on charge accumulated in the first region 101. Accordingly, if the capacitances at the nodes B and D are equal here, then Vsig1=Vsig2. The optical signal is doubled. Moreover, various types of noise such as optical shot noise and circuit noise are the square root of two at the maximum, and are improved to the square root of two as S/N.

On the other hand, if the signal charge is electrons, the second potential VP2 is a potential lower than the first potential VP1. Moreover, the first rest potential Vres1 is set to be lower than the potential Vs of the upper electrode S106.

In the exemplary embodiment, the potential of the photoelectric conversion layer 108 is controlled to transfer positive holes accumulated in the first region 101 to the second region 103. At this point in time, the change amount dVM of the potential of the electrode P110 (the node B) is to be large to easily form the slope of the potential from the first region 101 to the second region 103. The amount of charge remaining in the first region 101 can be reduced. Accordingly, the potential change amount is increased to enable an improvement in use efficiency of a signal.

Figure 8:
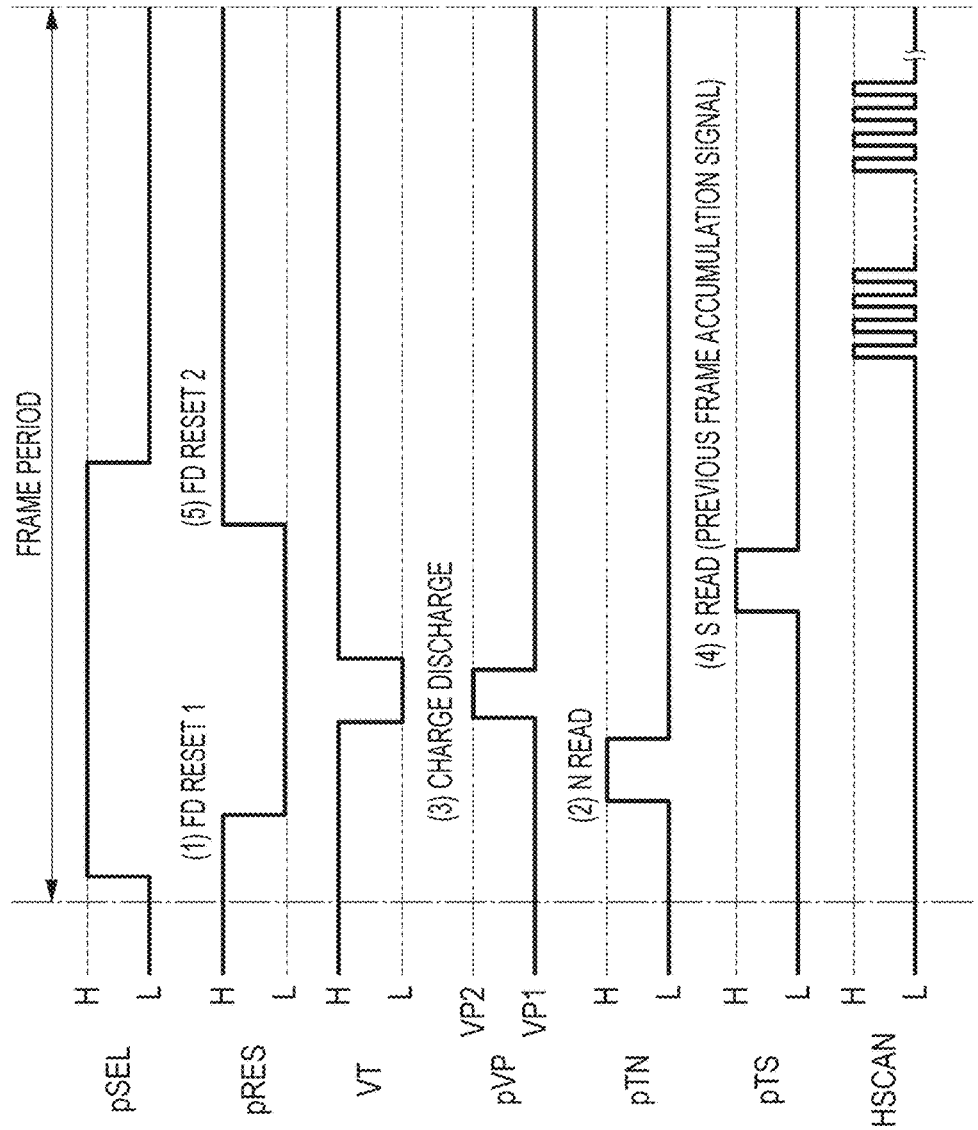
FIG. 8 is a drive signal diagram of the imaging apparatus.
Figure 9:
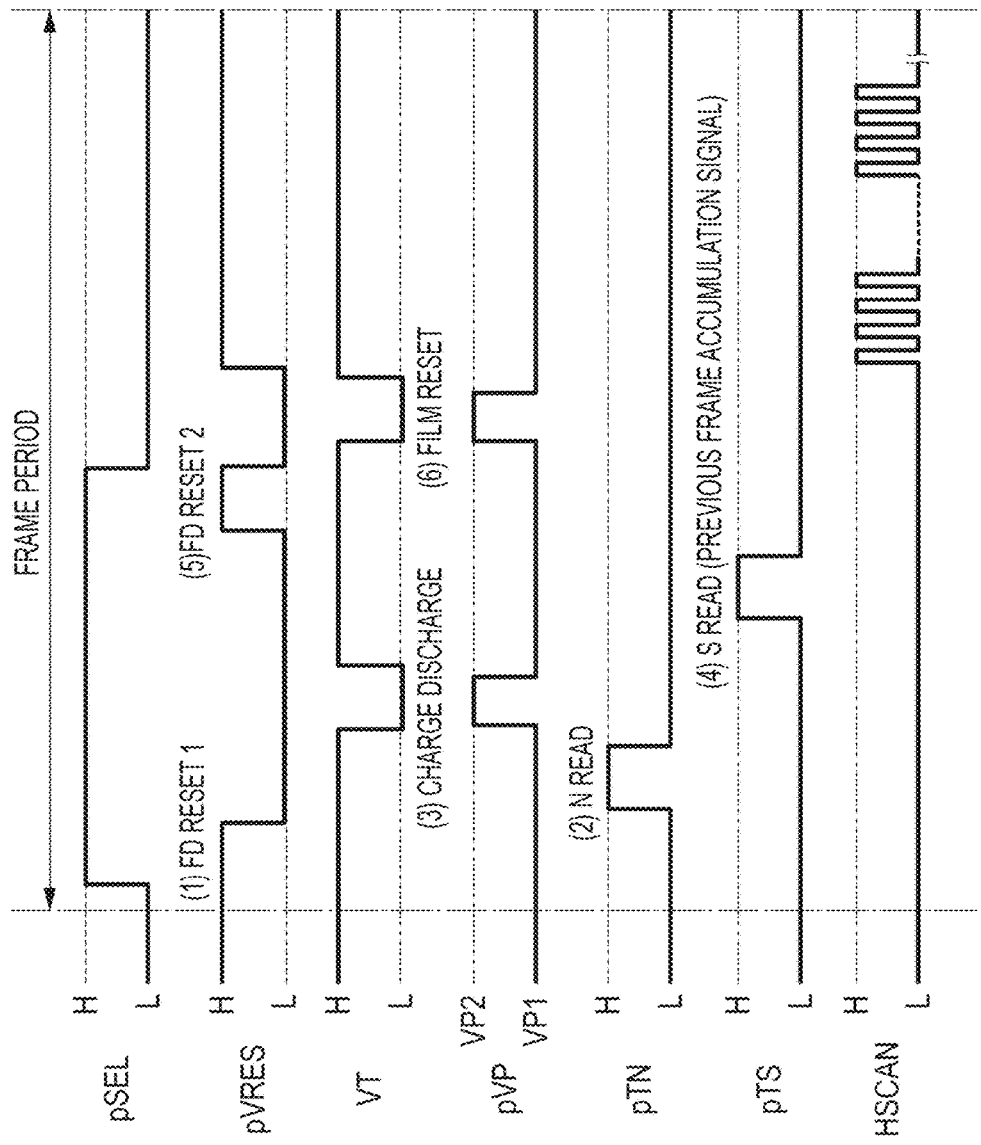
FIG. 9 is a drive signal diagram of the imaging apparatus.

Next, the operation of the pixel circuit is described using drive signal diagrams of the imaging apparatus illustrated in FIGS. 8 and 9. FIGS. 8 and 9 illustrate drive signals corresponding to the operations of outputting signals of one row.

Firstly, the drive signal pSEL goes to high level in a row where the output operation is performed to select pixels. Next, the drive signal pRES is supplied to the gates of the first reset transistor 117 and the second reset transistor 122. A drive signal pVT is supplied to the transfer electrode T111. The drive signal pTS is supplied to the S/H switch 302. The drive signal pTN is supplied to the S/H switch 303. A drive signal HSCAN is supplied to the column drive circuit 202.

When the drive signal pRES, pTN, or pTS is at high level (H level), its corresponding transistor or switch is on. When the drive signal pRES, pTN, or pTS is at low level (L level), its corresponding transistor or switch is off. The high and low levels of these drive signals are set according to the threshold potentials of the transistors and switches. FIGS. 8 and 9 illustrate timing charts of the drive signal pVP. The drive signal pVP indicates the potential supplied by the potential control portion VP113 to the electrode P110, and includes the first potential VP1 and the second potential VP2 larger than the first potential VP1.

The operations using the drive signals illustrated in FIG. 8 are described. Firstly, the drive signal pRES is at high level. Accordingly, the potential of the electrode P110 is reset to the first reset potential Vres1, and the potential of the electrode D112 is reset to the second reset potential Vres2.

The drive signal pRES subsequently goes to low level. Accordingly, the reset transistor 117 is turned off, and the node (node B) including the electrode P110 floats.

The drive signal pTN goes to high level to turn on the S/H switch 303. Consequently, as described above, the noise differential signal N output from the differential amplifier circuit 301 is retained. The drive signal pTN goes to low level to turn off the S/H switch 303.

Next, the drive signal pVT transitions to low level to remove the potential barrier between the first region 101 and the second region 103. Furthermore, the potential control portion VP113 supplies the second potential VP2 to the electrode P110. Consequently, the signal charge is transferred from the first region 101 to the second region 103. When the transfer of the signal charge is finished, the potential control portion VP113 supplies the first potential VP1 to the electrode P110. The drive signal pVT then transitions to a potential at high level to generate a potential barrier between the first region 101 and the second region 103.

The drive signal pTS subsequently transitions to high level to turn on the S/H switch 302. Consequently, the optical differential signal S output from the differential amplifier circuit 301, which has been described above, is retained. The drive signal pRES transitions to high level to reset the potentials of the electrodes P110 and D112 again.

The drive signal HSCAN is a clock signal supplied to the column drive circuit 202 to operate an unillustrated shift register included in the column drive circuit 202. The pulse shift operation is performed in accordance with the clock signal period. The drive signals CSEL corresponding to the columns are supplied sequentially to a plurality of the column circuits 204 in such a manner as to cause signals from the column circuits 204 to be output sequentially, column by column.

In the operations using the drive signals illustrated in FIG. 9, the film is reset before the accumulation of the signal charge is started. Specifically, after the drive signal pTS transitions to low level, the drive signal pRES is changed from low level to high level and then from high level to low level. The drive signal VT is changed from high level to low level, the drive signal VP from low level to high level and then to low level, and the drive signal VT from low level to high level.

In this manner, operations similar to those performed for the transfer of the signal charge described in FIG. 8 are performed. Such drive enables a reduction in charge remaining before the start of exposure of the next frame. As a result, noise such as an image lag can be reduced.

As described above, in the exemplary embodiment, charge is transferred from the first region 101 of the photoelectric conversion layer 108 to the second region 103 of the photoelectric conversion layer 108 along the direction parallel to the surface of the substrate where the pixel circuit is placed. The amount of change in potential of the electrode P110 is obtained as a signal output from the signal output circuit 130. The amount of change in potential of the electrode D112 is obtained as a signal output from the signal output circuit 131. A difference between the signal output from the signal output circuit 130 and the signal output from the signal output circuit 131 is taken. Accordingly, a signal obtained by adding the absolute values of the two signals can be obtained. As a result, the use efficiency of a signal based on charge accumulated in the photoelectric conversion layer can be improved.

The amount of change in potential of the electrode P110 is output from the first amplification transistor 118 included in the signal output circuit 130. The amount of change in potential of the electrode D112 is output from the second amplification transistor 123 included in the signal output circuit 131. Hence, the amplification transistor is placed in each of the signal output circuits to increase the area of an equivalent gate as compared to a case where the amplification transistor is shared between the two signal output circuits. Accordingly, RTN can be reduced. Moreover, a difference between the amount of change in potential of the electrode P110 and the amount of change in potential of the electrode D112 is amplified to also enable the cancellation of the same phase noise generated in the signal line. Accordingly, noise can be reduced.

Second Exemplary Embodiment

An imaging apparatus of the exemplary embodiment is described using FIGS. 10 to 13. Parts to which the same reference numerals are assigned in the drawings indicate the same elements or regions. Similar reference numerals are assigned to parts having similar functions to FIGS. 1A to 9, and their detailed description is omitted. In the second exemplary embodiment, FIGS. 2 to 5B have the common configuration to the first exemplary embodiment.

The exemplary embodiment is different from the first exemplary embodiment in the respect that an insulating layer 409 is placed between the electrode D112 and the photoelectric conversion layer 108.

Figure 10:
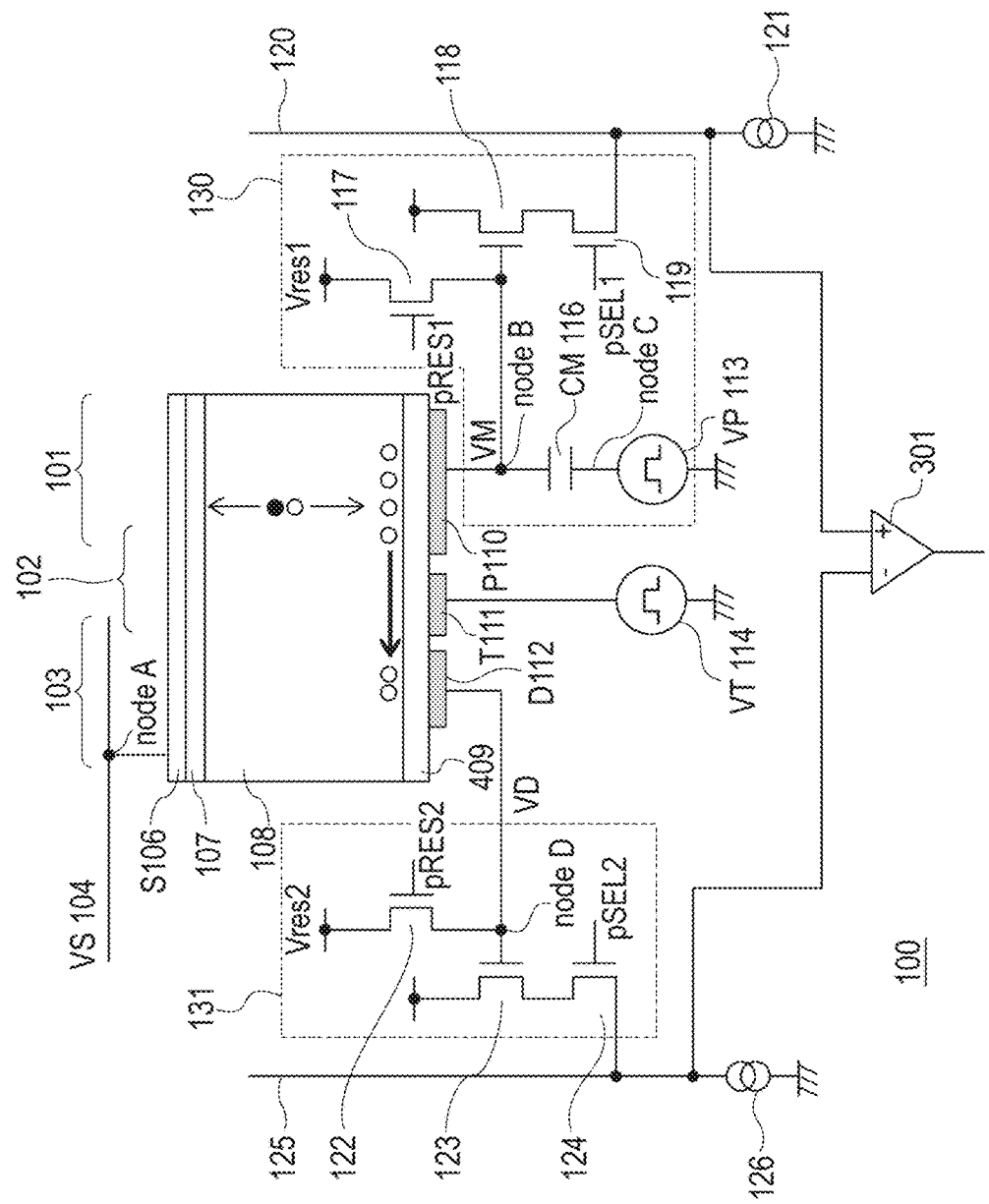
FIG. 10 is a schematic diagram of a pixel structure of the imaging apparatus.

In FIG. 10, the insulating layer 409 is placed between the electrode P110 and the photoelectric conversion layer 108. The insulating layer 409 extends from between the electrode P110 and the photoelectric conversion layer 108 to between the electrode D112 and the photoelectric conversion layer 108. In FIG. 10, the potential VS of the upper electrode is not fixed.

Next, operation of the exemplary embodiment is described using FIGS. 11A to 11F. Differences from FIGS. 6A to 6F are described here. FIG. 11A illustrates a state where positive holes generated by photoelectric conversion are accumulated in the first region 101. FIG. 11D illustrates a schematic diagram of the potential of positive holes in the first region 101, the third region 102, and the second region 103, the schematic diagram corresponding to FIG. 11A.

In this case, the potential VM of the electrode P110, the potential VT of the transfer electrode T111, and the potential VD of the electrode D112 satisfy the relationship of VD=VM<VT, the relationship of VD<VM <VT, the relationship of VM<VD<VT, or a relationship of VM<VT=VD.

Also in this case, as in the first exemplary embodiment, the potential VT supplied to the transfer electrode T111 controls the potential barrier between the first region 101 and the second region 103 to switch the electrical connection.

FIG. 11B illustrates a state where the positive holes accumulated in the first region 101 are being transferred to the second region 103. FIG. 11E illustrates a schematic diagram of the potential of positive holes in the first region 101, the third region 102, and the second region 103, the schematic diagram corresponding to FIG. 11B. In this case, the potential VM of the electrode P110, the potential VT of the transfer electrode T111, and the potential VD of the electrode D112 satisfy the relationship of VD=VT<VM or the relationship of VD<VT<VM.

The slope of the potential is formed between the first region 101 and the second region 103 on the basis of the relationship. Hence, the positive holes accumulated in the first region 101 are transferred to the second region 103 along the interface between the photoelectric conversion layer 108 and the insulating layer 109. The charge transferred to the second region 103 is then accumulated in the second region 103.

FIG. 11C illustrates a state after the signal charge is transferred to the second region 103. FIG. 11F illustrates a schematic diagram of the potential of positive holes in the first region 101, the third region 102, and the second region 103, the schematic diagram corresponding to FIG. 11C. At this point in time, the relationship of VM<VD<VT is satisfied, and in terms of charge, the signal charge is accumulated in the second region 103.

When the state of FIG. 11A changes to the state of FIG. 11C, a change in potential of the input node B is output as the signal of the signal output circuit 130, and a change in potential of the input node D as the signal of the signal output circuit 131. As described in the first exemplary embodiment, an added signal of the absolute value of the signal output from the signal output circuit 130 and the absolute value of the signal output from the signal output circuit 131 is acquired as a differential signal via the differential amplifier circuit 301.

After the signal is output from each signal output circuit, the signal charge accumulated in the second region 103 is discharged to the upper electrode S106 and then reset.

Next, the operation of outputting a signal by transferring the signal charge to the second region 103 is described using FIG. 12. In FIG. 12, an energy band structure of the first region 101 is similar to that of FIG. 7.

An energy band structure of the second region 103 in step d2 is a similar energy band structure to the one in step p3 of FIG. 12. Step d2 is the step of accumulating the signal charge transferred from the first region 101.

Next, step d3 is the step of discharging the signal charge accumulated in the second region 103 to the upper electrode S106. As illustrated in step d1, the second region 103 enters a state where the signal charge is not accumulated.

Next, the operation of the pixel circuit in the exemplary embodiment is described. The operation of the pixel circuit is similar to steps m1 to m3 described in the first exemplary embodiment.

Figure 13:
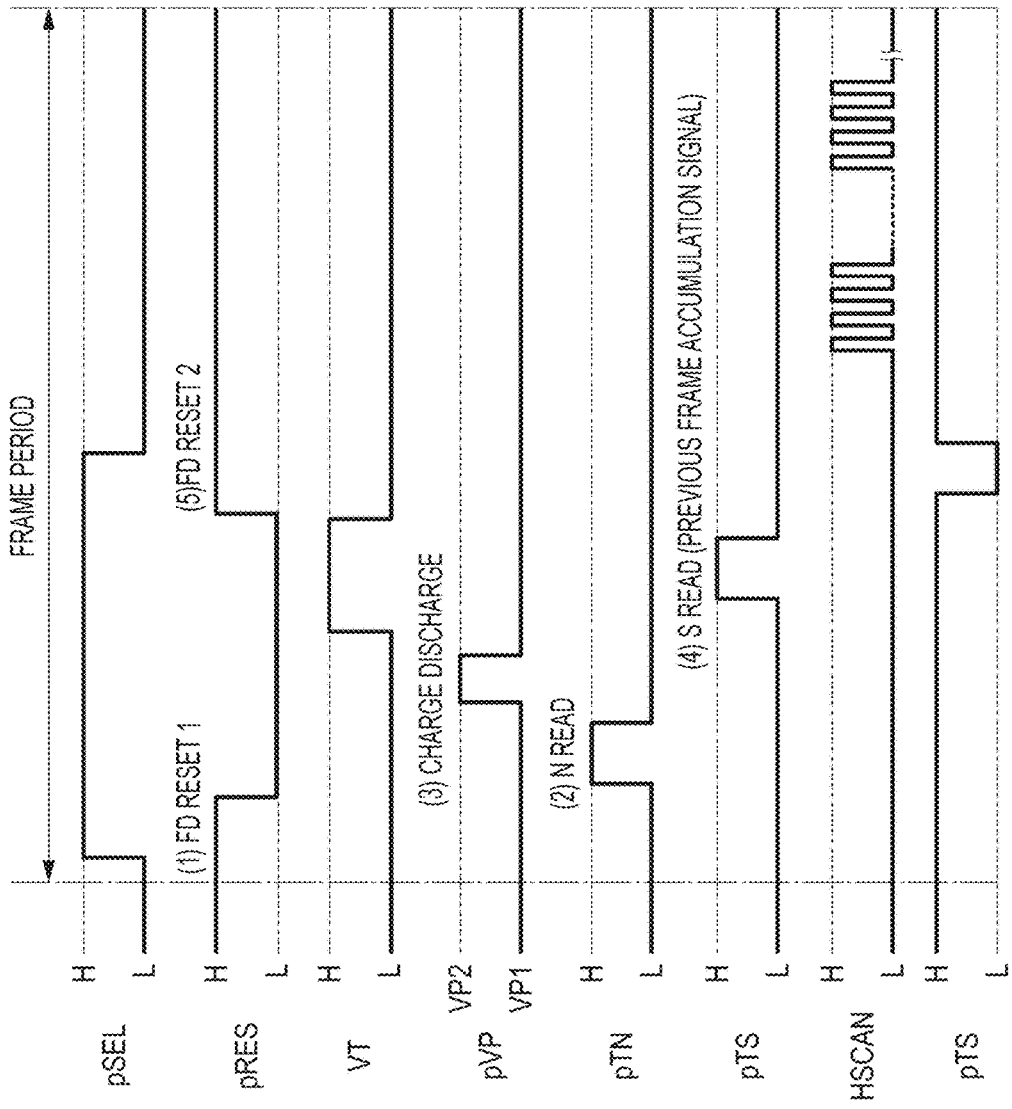
FIG. 13 is a drive signal diagram of the imaging apparatus.

Next, the operation of the pixel circuit in the exemplary embodiment is specifically described using a drive signal diagram of the imaging apparatus illustrated in FIG. 13. FIG. 13 illustrates drive signals corresponding to operations of reading signals of one row.

Firstly, the drive signal pSEL goes to high level in a row where the output operation is performed to select pixels. The drive signal pREs is at high level. Accordingly, the potential of the electrode P110 is reset to the first reset potential Vres1, and the potential of the electrode D112 to the second reset potential Vres2.

The drive signal pRES subsequently goes to low level to turn off the reset transistor 117. The input node (node B) including the electrode P110 floats. Moreover, the reset transistor 122 is turned off to cause the input node (node D) including the electrode D112 to float.

The drive signal pTN goes to high level to turn on the S/H switch 303. Consequently, as described above, the noise differential signal N output from the differential amplifier circuit 301 is retained. The drive signal pTN goes to low level to turn off the S/H switch 303.

Next, the potential control portion VP113 supplies the second potential VP2 to the electrode P110. Consequently, the signal charge is transferred from the first region 101 to the second region 103. When the transfer of the signal charge is finished, the potential control portion VP113 supplies the first potential VP1 to the electrode P110.

Next, the drive signal pVT transitions to high level to remove the potential barrier between the first region 101 and the second region 103.

Moreover, the drive signal pTS transitions to high level to turn on the S/H switch 302. Consequently, the optical differential signal S output from the differential amplifier circuit 301, which has been described above, is retained. The drive signal pRES transitions to high level to reset the potentials of the electrodes P110 and D112 again.

The drive signals pTS and pVT then transition to high potentials. A potential barrier is generated between the first region 101 and the second region 103.

Next, the potential VS is changed from high level to low level. Consequently, the charge transferred to the second region 103 can be discharged toward the upper electrode S106. However, the upper electrode S106 is shared on a row basis. The voltage is switched sequentially on a row basis.

The drive signal HSCAN is a clock signal supplied to the column drive circuit 202 to operate an unillustrated shift register included in the column drive circuit 202. The pulse shift operation is performed in accordance with the clock signal period. The drive signals CSEL corresponding to the columns are supplied sequentially to a plurality of the column circuits 204 in such a manner as to cause signals from the column circuits 204 to be output sequentially, column by column.

Also in the configuration of the exemplary embodiment, the use efficiency of a signal based on charge accumulated by the photoelectric conversion layer can be improved.

Third Exemplary Embodiment

Figure 14:
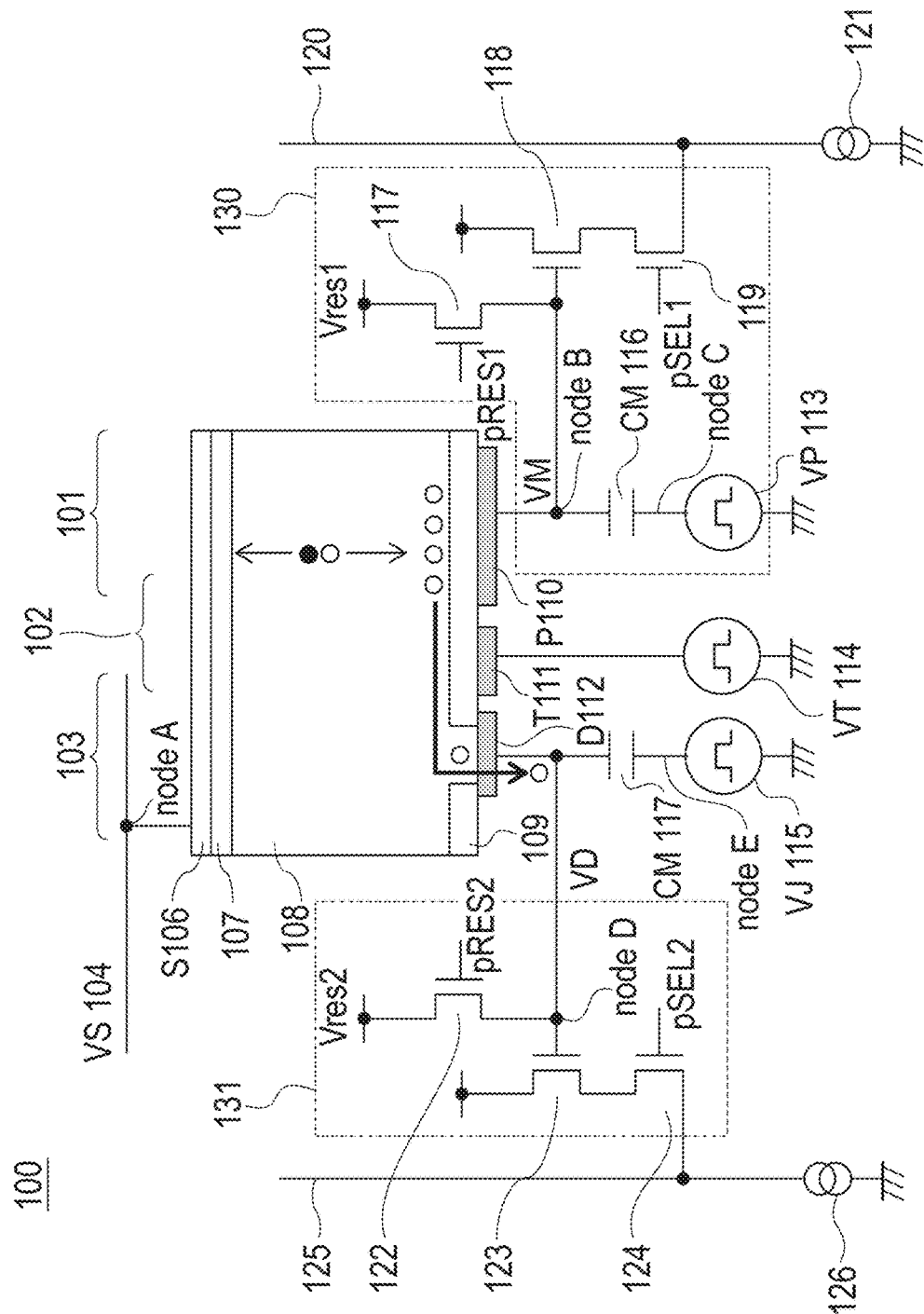
FIG. 14 is a schematic diagram of a pixel configuration of the imaging apparatus.
Figure 15:
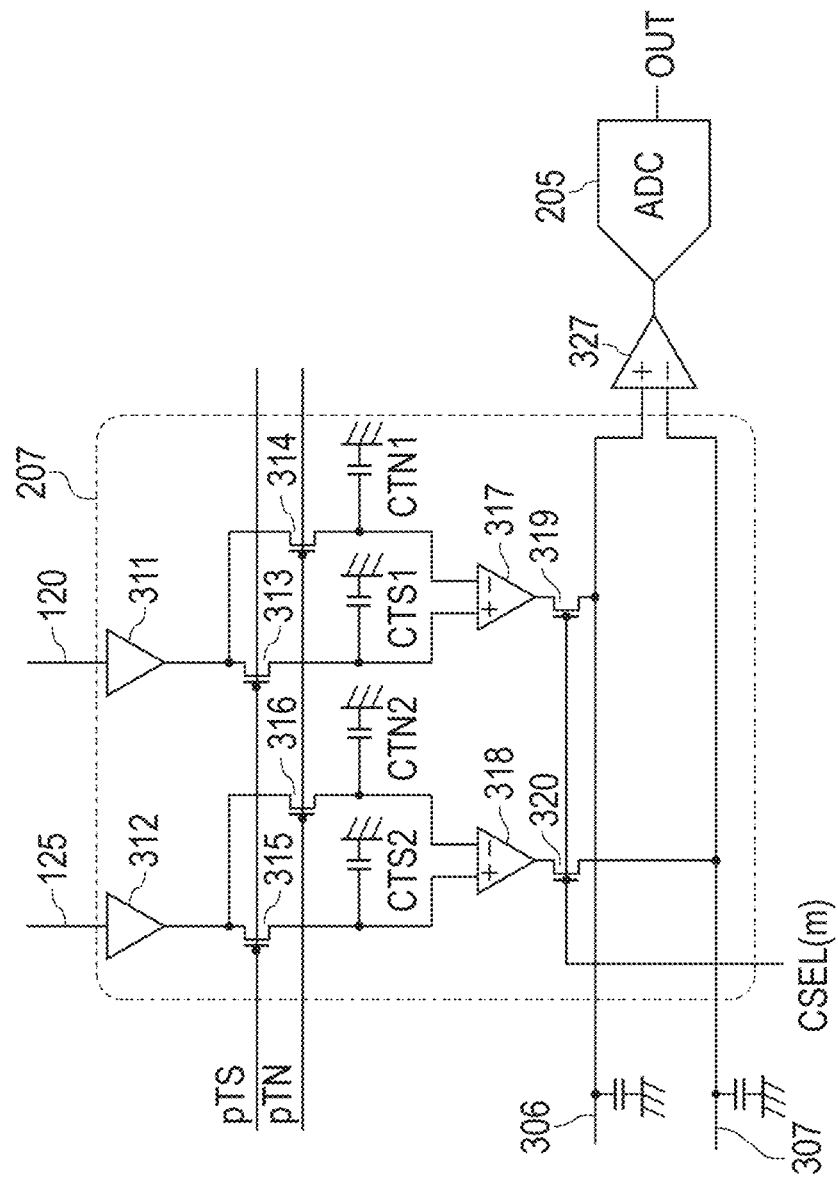
FIG. 15 is an equivalent circuit diagram of a column circuit of the imaging apparatus.
Figure 16:
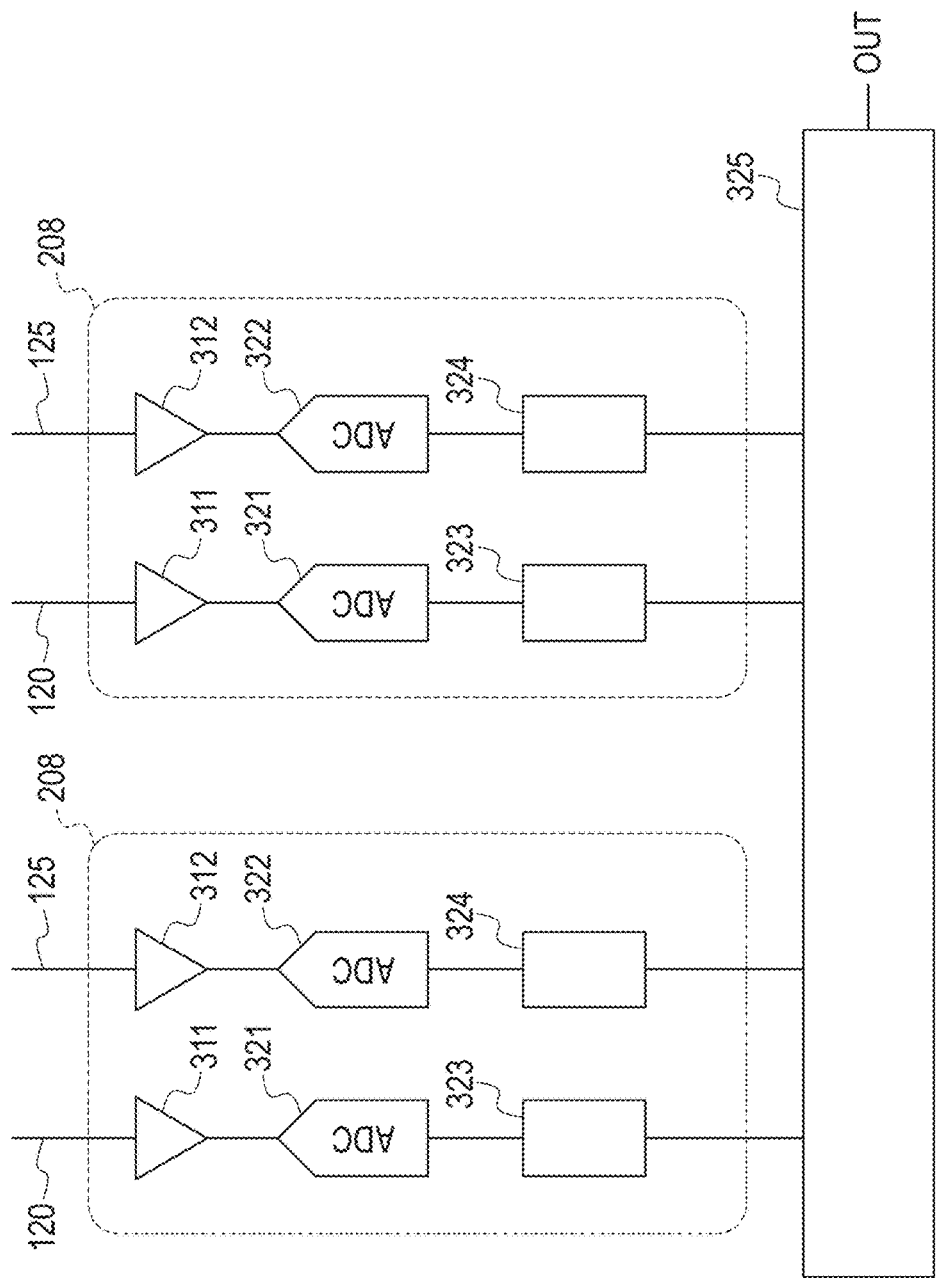
FIG. 16 is an equivalent circuit diagram of column circuits of the imaging apparatus.

An imaging apparatus of the exemplary embodiment is described using FIGS. 14 to 16. Parts to which the same reference numerals are assigned in the drawings indicate the same elements or regions. Similar reference numerals are assigned to parts having similar functions to FIGS. 1A to 13, and their detailed description is omitted.

The exemplary embodiment is different from the first exemplary embodiment in the respect that a potential control portion VJ115 and a second capacitor CM117 are included.

Furthermore, in the exemplary embodiment, the differential amplifier circuit takes a difference between a signal output from the first signal output circuit and a signal output from the second signal output circuit. Consequently, the work of removing a noise signal from the signal output from each signal output circuit is performed before the difference signal is acquired, which is the point different from the first exemplary embodiment. Specifically, the difference between the noise signal N1+the optical signal S1 output from the first signal output circuit and the noise signal N1 is taken to acquire the optical signal S1. The difference between the noise signal N2+an optical signal S2 output from the second signal output circuit and the noise signal N2 is taken to acquire the optical signal S2. A difference signal is acquired by the differential amplifier circuit using the acquired signal.

FIG. 14 is a schematic diagram of the pixel configuration of the imaging apparatus of the exemplary embodiment. In FIG. 14, the potential control portion VJ115 is connected to the input node D of the second amplification transistor 123 and the electrode D112 via the second capacitor CM117. The potential control portion VJ115 supplies a plurality of potentials including a fifth and a sixth potential to the electrode D112 via the second capacitor CM117. The fifth potential is a potential that collects charge in the second region 103. The sixth potential is a potential that transfers the charge in a direction opposite to the first direction. The potential VD is supplied to the node D, and a potential VJ to a node E. The potentials VJ and VD have a relationship in accordance with the capacitance value of the first capacitor CM116.

With such a configuration, when charge is accumulated in the first region 101, the potential control portion VP113 supplies the first potential to the electrode P110, and the potential control portion VJ115 supplies the fourth potential to the electrode D112. With such a potential relationship, a potential gradient that facilitates charge to move from the second region 103 to the first region 101 can be formed. As a result, charge is likely to be accumulated in the first region.

Moreover, when the charge accumulated in the first region 101 is transferred to the second region 103, the potential control portion VP113 supplies the second potential to the electrode P110. The potential control portion VJ115 then supplies the third potential to the electrode D112 to enable quick transfer of the charge to the second region 103. With such a potential relationship, a potential gradient that facilitates the charge to move from the first region 101 to the second region 103 can be formed. As a result, the drive speed of the imaging apparatus can be increased.

Moreover, in FIG. 14, the first signal line 120 and the second signal line 125 are not directly coupled to the differential amplifier circuit corresponding to the differential amplifier circuit 301 of the first exemplary embodiment, unlike FIG. 1.

Next, an equivalent circuit diagram of a column circuit of the exemplary embodiment is described using FIG. 15. Only points different from FIG. 3 are described here. FIG. 15 illustrates an equivalent circuit of a column circuit 207 of the m-th column. The column circuits 207 of the other columns are omitted.

The first signal line 120 and the second signal line 125 are connected to their corresponding column circuit 207. The column drive circuit 202 can drive the column circuits 207, column by column, and output signals, which have been output row by row, sequentially to an output portion.

The column circuit 207 includes a first column amplifier 311 and a second column amplifier 312. The first signal line 120 is connected to the first column amplifier 311, and the second signal line 125 to the second column amplifier 312.

A signal of the first signal line 120 is amplified by the first column amplifier 311. A signal of the second signal line 125 is amplified by the second column amplifier 312. However, the first column amplifier 311 and the second column amplifier 312 may not be placed. Moreover, the first column amplifier 311 and the second column amplifier 312 may be placed in the configuration of each exemplary embodiment.

An output node of the first column amplifier 311 is connected to a capacitor CTS1 via an S/H switch 313. Moreover, the output node of the first column amplifier 311 is connected to a capacitor CTN1 via an S/H switch 314. The S/H switches 313 and 314 are controlled by the drive signals pTS and pTN, respectively. The capacitors CTS1 and CTN1 are further connected to a third differential amplifier circuit 317.

An output node of the second column amplifier 312 is connected to a capacitor CTS2 via an S/H switch 315. Moreover, the output node of the second column amplifier 312 is connected to a capacitor CTN2 via an S/H switch 316. The S/H switches 315 and 316 are controlled by the drive signals pTS and pTN, respectively. The capacitors CTS2 and CTN2 are further connected to a fourth differential amplifier circuit 318.

The third differential amplifier circuit 317 outputs the optical signal S1 being the difference signal between the optical signal S1+the noise signal N retained in the capacitor CTS1 and the noise signal N retained in the capacitor CTN1. The fourth differential amplifier circuit 318 outputs the optical signal S1 being the difference signal between the optical signal S2+the noise signal N retained in the capacitor CTS2 and the noise signal N retained in the capacitor CTN2.

An output node of the third differential amplifier circuit 317 is connected to the signal line 306 via a transfer switch 319. An output portion of the fourth differential amplifier circuit 318 is connected to the signal line 307 via a transfer switch 320. The transfer switches 319 and 320 are controlled by the drive signal CSEL from the column drive circuit.

Both of the signal lines 306 and 307 are connected to a differential amplifier circuit 327. The differential amplifier circuit 327 corresponds to the differential amplifier circuit 301 of the first exemplary embodiment. The differential amplifier circuit 327 amplifies and outputs a difference signal between the signals of the signal lines 306 and 307.

At this point in time, the signal of the signal line 306 electrically connects to the signal output circuit 130, and corresponds to a signal output from the signal output circuit 130. The signal of the signal line 307 electrically connects to the signal output circuit 131, and corresponds to a signal output from the signal output circuit 131. Hence, the polarities of the signals of the signal lines 306 and 307 are opposite. A difference signal output from the differential amplifier circuit 327 is an added value of the absolute values of the signals of the signal lines 307 and 306.

The signal output from the differential amplifier circuit 327 is input into the analog-to-digital conversion portion 205, converted from an analog signal to a digital signal, and then output to the outside of the imaging apparatus. Such a configuration enables a reduction in noise generated from the pixel circuit by analog-to-digital conversion with the column circuits.

An analog-to-digital converter circuit may be used for the column circuit 207. The column circuit at this point in time is, for example, a column circuit 208 of FIG. 16. The column circuit 208 converts output signals of the first column amplifier 311 and the second column amplifier 312 from analog to digital. An output of the first column amplifier 311 is connected to an analog-to-digital conversion portion 321. An output of the second column amplifier 312 is connected to an analog-to-digital conversion portion 322. An output of the analog-to-digital conversion portion 321 is connected to a memory 323. An output of the analog-to-digital conversion portion 322 is connected to a memory 324. The memories 323 and 324 are connected to a digital signal processing circuit 325.

The analog-to-digital conversion portion 321 converts the noise signal N1 and optical signal S1 signal output from the first signal line 120 into a digital signal to retain the signal in the memory 323. The analog-to-digital conversion portion 322 converts the noise signal N2 and optical signal S2 signal output from the second signal line 125 into a digital signal to retain the signal in the memory 324. The digital signal processing circuit generates a difference signal D1 (=S1−N1) being the digitized noise signal N1 and optical signal S1 signal, and generates a difference signal D2 (=S2−N2) being the digitized noise signal N2 and optical signal S2 signal. Furthermore, a difference signal between the difference signal D1 and the difference signal D2 is generated. In this manner, the analog-to-digital conversion is performed in the column circuit to enable a reduction in noise generated from the circuit.

Hence, the configuration of the exemplary embodiment can also improve the use efficiency of a signal based on charge accumulated in the photoelectric conversion layer. In the exemplary embodiment, two differences are described. However, both differences can be applied in all the exemplary embodiments.

Fourth Exemplary Embodiment

Figure 17:
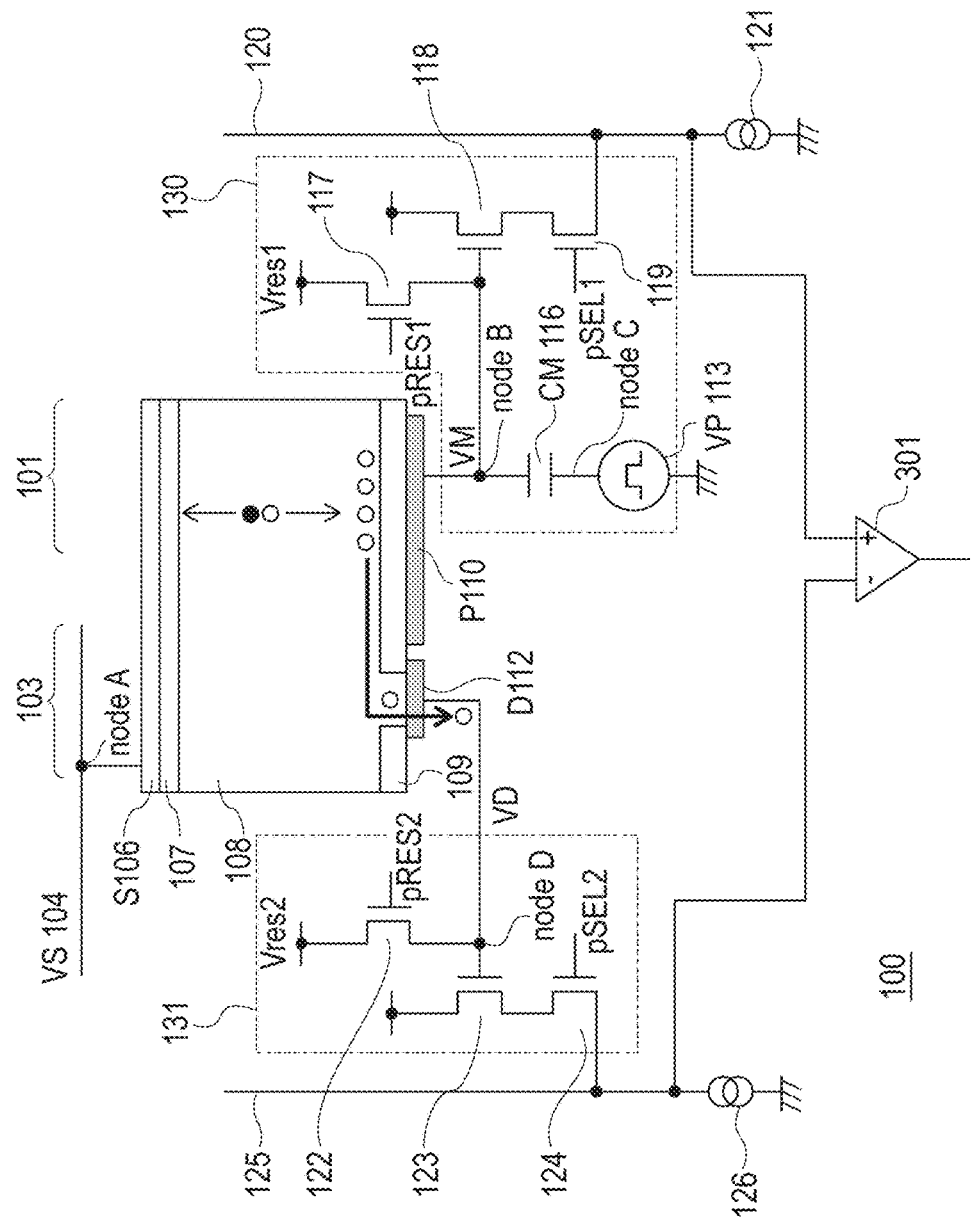
FIG. 17 is a schematic diagram of a pixel configuration of the imaging apparatus.

An imaging apparatus of the exemplary embodiment is described using FIG. 17. Parts to which the same reference numerals are assigned in the drawings indicate the same elements or regions. Similar reference numerals are assigned to parts having similar functions to FIGS. 1A to 16, and their detailed description is omitted.

The difference between the first exemplary embodiment and the present exemplary embodiment is that the third region 102, the transfer electrode T111, and the power supply VT114 are not placed.

A pixel configuration of the imaging apparatus of the exemplary embodiment is illustrated in FIG. 17. As illustrated in FIG. 17, the pixel 100 does not include the third region 102, the transfer electrode T111, and the power supply VT114.

In the exemplary embodiment, the potential VP supplied by the potential control portion VP113 is controlled to transfer charge from the first region 101 to the second region 103.

If the signal charge is positive holes, the relationship between the potential VM of the electrode P110 and the potential VD of the electrode D112 is set as VD<VM. Accordingly, charge is transferred from the first region 101 to the second region 103. In a period during which charge is accumulated in the first region 101, the relationship between the potential VM of the electrode P110 and the potential VD of the electrode D112 is set as VD>VM. If the signal charge is electrons, the relationship between the potential VM of the electrode P110 and the potential VD of the electrode D112 is set as VD>VM. Accordingly, charge is transferred from the first region 101 to the second region 103. In the period during which charge is accumulated in the first region 101, the relationship between the potential VM of the electrode P110 and the potential VD of the electrode D112 is set as VM>VD.

In the exemplary embodiment, the pixel 100 does not include the third region 102. Such a configuration can reduce the pixel size.

Hence, the configuration of the exemplary embodiment can also improve the use efficiency of a signal based on the accumulated charge. The exemplary embodiment can be applied to all the exemplary embodiments.

Fifth Exemplary Embodiment

Figure 18:
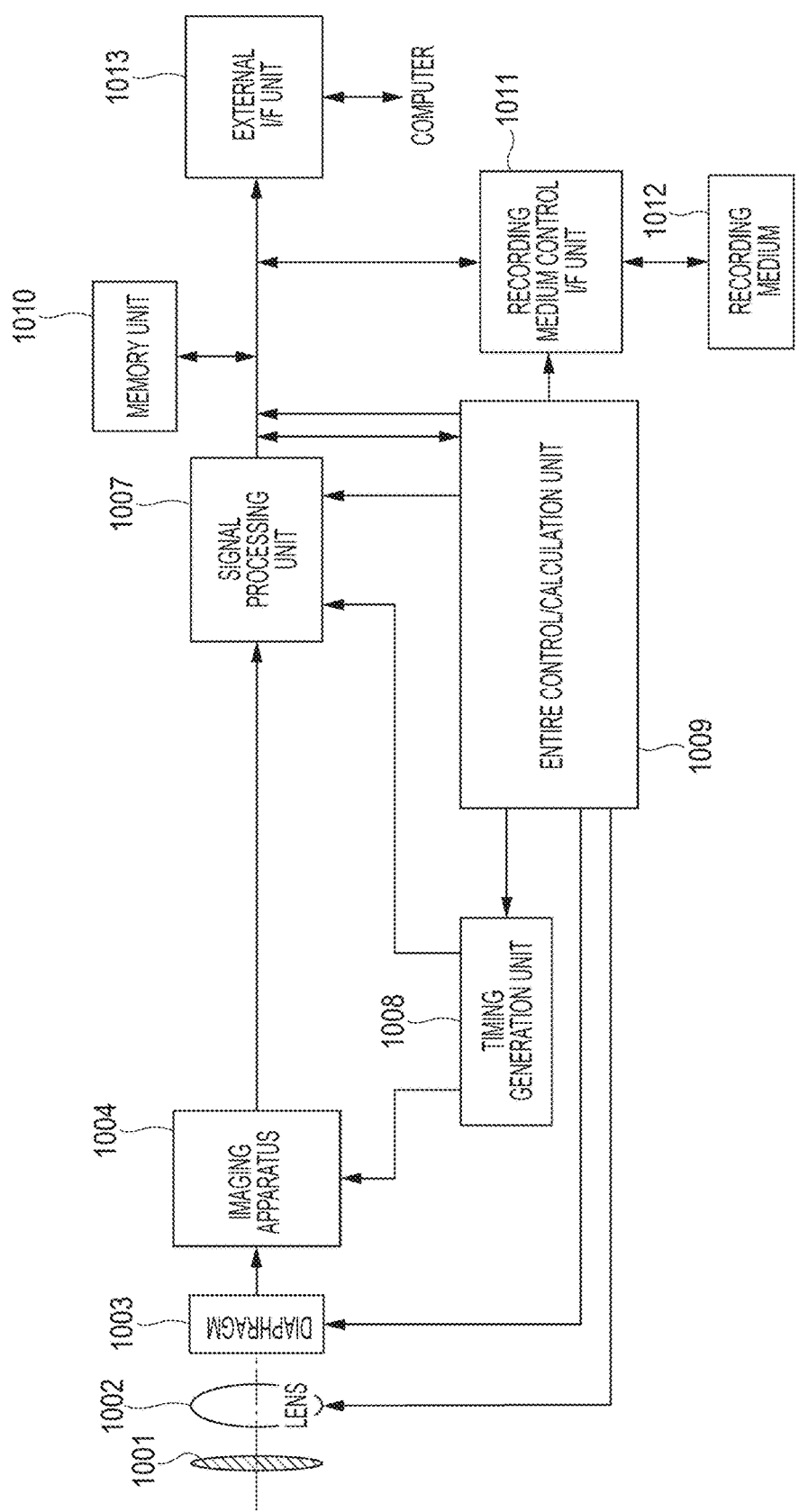
FIG. 18 is a block diagram of an exemplary embodiment of a photoelectric conversion system.

An exemplary embodiment of an imaging system according to the disclosure is described. Examples of the imaging system include a digital still camera, a digital camcorder, a camera head, a copier, a fax machine, a mobile phone, a vehicle-mounted camera, and an observation satellite. FIG. 18 illustrates a block diagram of a digital still camera as an example of the imaging system.

In FIG. 18, a barrier 1001 protects a lens, a lens 1002 forms an optical image of an object on an imaging apparatus 1004, and a diaphragm 1003 changes the amount of light that has passed through the lens 1002. The imaging apparatus 1004 is the imaging apparatus described in the above-mentioned exemplary embodiments, and converts the optical image formed by the lens 1002 as image data. It is assumed here that a semiconductor substrate of the imaging apparatus 1004 includes an AD conversion portion. A signal processing unit 1007 makes various corrections to imaging data output by the imaging apparatus 1004 and compresses the data. In FIG. 18, a timing generation unit 1008 outputs various timing signals to the imaging apparatus 1004 and the signal processing unit 1007. An entire control unit 1009 controls the entire digital still camera. A frame memory unit 1010 temporarily stores image data. An interface unit 1011 performs recording and reading on a recording medium. A detachable recording medium 1012 is, for example, a semiconductor memory for recording and reading imaging data. An interface unit 1013 is for communicating with an external computer and the like. Timing signals and the like may be input from the outside of the imaging system. The imaging system may include at least the imaging apparatus 1004, and the signal processing unit 1007 that processes an imaging signal output from the imaging apparatus 1004.

In the exemplary embodiment, the configuration has been described in which the imaging apparatus 1004 and the AD conversion unit are provided on different semiconductor substrates. However, the imaging apparatus 1004 and the AD conversion unit may be formed on the same semiconductor substrate. Moreover, the imaging apparatus 1004 and the signal processing unit 1007 may be formed on the same semiconductor substrate.

Moreover, each pixel 100 may be configured in such a manner as to include a first and a second photoelectric conversion portion. The signal processing unit 1007 may be configured in such a manner as to process a signal based on charge generated in the first photoelectric conversion portion and a signal based on charge generated in the second photoelectric conversion portion, and acquire information on the distance between the imaging apparatus 1004 and an object.

In the exemplary embodiment of the imaging system, the imaging apparatus of the first exemplary embodiment is used for the imaging apparatus 1004. In this manner, the exemplary embodiments according to the disclosure are applied in the imaging system, and accordingly an image where noise has been reduced can be acquired.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-254362, filed Dec. 27, 2016, which is hereby incorporated by reference herein in its entirety.

What is claimed is:

1. An imaging apparatus comprising a plurality of pixels each including:
    a pixel circuit in a substrate;
    a first and a second electrode above the substrate, placed sequentially in a first direction being a direction along a surface of the substrate;
    an upper electrode above the first and second electrodes;
    a photoelectric conversion layer between the first and second electrodes and the upper electrode; and
    an insulating layer between the first electrode and the photoelectric conversion layer, wherein
    the pixel circuit includes
        a first signal output circuit having a first amplification portion with a first input node connected to the first electrode,
        a second signal output circuit having a second amplification portion with a second input node connected to the second electrode,
        a first capacitor connected to the first electrode and the first input node, and
        a first potential control portion configured to control a potential of the first electrode via the first capacitor, and
    the first potential control portion supplies a first potential that collects signal charge generated in the photoelectric conversion layer, or a second potential that transfers the signal charge in the first direction, to the first electrode.

2. The imaging apparatus according to claim 1, comprising a first differential circuit, wherein
    an output node of the first signal output circuit and a non-inverting input terminal of the first differential circuit are connected, and
    an output node of the second signal output circuit and an inverting input terminal of the first differential circuit are connected.

3. The imaging apparatus according to claim 2, comprising:
    a first and a second signal line connected to an output node of the first differential circuit; and
    a second differential circuit including
        a non-inverting input terminal connected to the first signal line, and
        an inverting input terminal connected to the second signal line.

4. The imaging apparatus according to claim 2, comprising:
    a third differential circuit into which a first signal including an optical signal and a noise signal, which are output from the first signal output circuit, and a second signal being the noise signal are input, and from which a first difference signal between the first signal and the second signal is output; and
    a fourth differential circuit into which a third signal including an optical signal and a noise signal, which are output from the second signal output circuit, and a fourth signal being the noise signal are input, and from which a second difference signal between the third signal and the fourth signal is output, wherein
    an output node of the third differential circuit and the non-inverting input terminal of the first differential circuit are connected, and
    an output node of the fourth differential circuit and the inverting input terminal of the first differential circuit are connected.

5. The imaging apparatus according to claim 1, wherein the insulating layer is not placed in at least a part of an area between the second electrode and the photoelectric conversion layer.

6. The imaging apparatus according to claim 1, wherein the insulating layer is placed extending from between the first electrode and the photoelectric conversion layer to between the second electrode and the photoelectric conversion layer.

7. The imaging apparatus according to claim 1, wherein
    the photoelectric conversion layer includes a first region between the first electrode and the upper electrode, and a second region between the second electrode and the upper electrode, and
    charge in the first region is transferred in the first direction from the first region to the second region.

8. The imaging apparatus according to claim 1, wherein the second electrode is placed such as to surround the first electrode in plan view.

9. The imaging apparatus according to claim 7, wherein the photoelectric conversion layer includes a third region between the first and second regions, and is provided with a third electrode configured to control a potential of the third region.

10. The imaging apparatus according to claim 9, wherein, in plan view, the third electrode is placed such as to surround the first electrode, and the second electrode is placed such as to surround the third electrode.

11. The imaging apparatus according to claim 9, wherein
    the pixel circuit includes a second potential control portion configured to control a potential of the third electrode,
    the second potential control portion supplies, to the third electrode, a third potential that forms a potential barrier in the third region, and a fourth potential,
    upon the first potential control portion supplying the first potential to the first electrode, the second potential control portion supplies the third potential to the third electrode, and upon the first potential control portion supplying the second potential to the first electrode, the second potential control portion supplies the fourth potential to the third electrode.

12. The imaging apparatus according to claim 1, wherein the pixel circuit includes
a second capacitor connected to the second electrode and the second input node, and
a third potential control portion configured to control a potential of the second electrode via the second capacitor, and
the third potential control portion supplies a fifth potential that collects the signal charge, or a sixth potential that transfers the signal charge in a direction opposite to the first direction, to the second electrode.

13. The imaging apparatus according to claim 12, wherein
upon the first potential control portion supplying the first potential to the first electrode, the third potential control portion supplies the sixth potential to the second electrode, and
upon the first potential control portion supplying the second potential to the first electrode, the third potential control portion supplies the fifth potential to the second electrode.

14. The imaging apparatus according to claim 1, comprising a blocking layer between the photoelectric conversion layer and the upper electrode.

15. The imaging apparatus according to claim 1, wherein
the output node of the first signal output circuit is connected to a first column amplifier configured to amplify a signal of the first signal output circuit, and
the output node of the second signal output circuit is connected to a second column amplifier configured to amplify a signal of the second signal output circuit.

16. The imaging apparatus according to claim 1, wherein
the first signal output circuit includes a first reset portion configured to reset the potential of the first electrode to a reset potential, and a first selection portion configured to switch an electrical connection between an output node of the first amplification portion and a first signal line,
the second signal output circuit includes a second reset portion configured to reset a potential of the second electrode to a reset potential, and a second selection portion configured to switch a connection between an output node of the second amplification portion and a second signal line, and
the first and second reset portions are controlled by a reset common signal, and the first and second selection portions are controlled by a selection common signal.

17. An imaging system comprising:
an imaging apparatus comprising a plurality of pixels each including:
a pixel circuit in a substrate;
a first and a second electrode above the substrate, placed sequentially in a first direction being a direction along a surface of the substrate;
an upper electrode above the first and second electrodes;
a photoelectric conversion layer between the first and second electrodes and the upper electrode; and
an insulating layer between the first electrode and the photoelectric conversion layer,
wherein the pixel circuit includes
a first signal output circuit having a first amplification portion with an input node connected to the first electrode,
a second signal output circuit having a second amplification portion with an input node connected to the second electrode,
a first capacitor connected to the first electrode and the input node of the first amplification portion, and
a first potential control portion configured to control a potential of the first electrode via the first capacitor, and
the first potential control portion supplies a first potential that collects signal charge generated in the photoelectric conversion layer, or a second potential that transfers the signal charge in the first direction, to the first electrode; and
a signal processing apparatus configured to process a signal output from the imaging apparatus.

18. The system according to claim 17, comprising a first differential circuit, wherein
an output node of the first signal output circuit and a non-inverting input terminal of the first differential circuit are connected, and
an output node of the second signal output circuit and an inverting input terminal of the first differential circuit are connected.

19. The system according to claim 17, wherein the insulating layer is not placed in at least a part of an area between the second electrode and the photoelectric conversion layer.

20. The system according to claim 17, wherein the insulating layer is placed extending from between the first electrode and the photoelectric conversion layer to between the second electrode and the photoelectric conversion layer.

* * * * *